(12) United States Patent
Mori et al.

(10) Patent No.: US 7,088,626 B2
(45) Date of Patent: Aug. 8, 2006

(54) BIAS VOLTAGE APPLYING CIRCUIT AND SEMICONDUCTOR MEMORY DEVICE

(75) Inventors: Yasumichi Mori, Ikoma (JP); Takahiko Yoshimoto, Kitakatsuragi-gun (JP); Masahiko Watanabe, Ikoma-gun (JP); Shinsuke Anzai, Tenri (JP); Takeshi Nojima, Nara (JP); Munetaka Masaki, Sakurai (JP)

(73) Assignee: Sharp Kabushiki Kaisha, Osaka (JP)

( * ) Notice: Subject to any disclaimer, the term of this patent is extended or adjusted under 35 U.S.C. 154(b) by 36 days.

(21) Appl. No.: 11/055,641

(22) Filed: Feb. 9, 2005

(65) Prior Publication Data

US 2005/0174859 A1 Aug. 11, 2005

(30) Foreign Application Priority Data

Feb. 9, 2004 (JP) ............................. 2004-031648
Dec. 2, 2004 (JP) ............................. 2004-349252

(51) Int. Cl.
*G11C 7/00* (2006.01)

(52) U.S. Cl. ............................. 365/189.11; 365/185.21; 365/185.2

(58) Field of Classification Search ........... 365/189.11, 365/185.2, 185.21, 189.07, 210, 208, 202, 365/189.09
See application file for complete search history.

(56) References Cited

U.S. PATENT DOCUMENTS 6,400,606 B1 * 6/2002 Cho ..................... 365/185.2

6,424,571 B1 7/2002 Pekny
6,563,737 B1 * 5/2003 Khouri et al. ......... 365/185.21

FOREIGN PATENT DOCUMENTS

JP 2003-077282 A 3/2003

OTHER PUBLICATIONS

Castro, H.A. et al. (2002). "A 125MHz Burst Mode 0.18μm 128Mbit 2 Bits per Cell Flash Memory," *CLSI Symposium*, 21.4:304-307.
Elmhurst, D. et al. (2003). "A 1.8V 128Mb 125 MHz Multi-level Cell Flash Memory with Flexible Read While Write" ISSCC Digest of Technical Papers 16.5:286-287.
European Search Report mailed Oct. 12, 2005 for European Patent No. 05250746.4, 3 pages.

* cited by examiner

*Primary Examiner*—Richard Elms
*Assistant Examiner*—Dang Nguyen
(74) *Attorney, Agent, or Firm*—Morrison & Foerster LLP

(57) ABSTRACT

Two bias circuits which supply a current to a selected memory cell and a reference memory cell have the same circuit constitution. Each bias circuit includes a first active element between a power supply node and a junction node, where a current is controlled to prevent a voltage level at the junction node from fluctuating, a second active element between the power supply node and an output node, where a current is controlled such that a voltage level at the output node is changed in direction opposite to a voltage level at the junction node in other bias circuit, a third active element and a fourth active element between the junction node and a current supply node and between the output node and the current supply node, respectively, where a bias voltage is adjusted.

28 Claims, 12 Drawing Sheets

BIAS VOLTAGE APPLYING CIRCUIT AND SEMICONDUCTOR MEMORY DEVICE

CROSS REFERENCE TO RELATED APPLICATION

This Nonprovisional application claims priority under 35 U.S.C. §119(a) on Patent Applications ser. No. 2004-031648 and No. 2004-349252 filed in Japan on Feb. 9, 2004 and on Dec. 2, 2004, respectively, the entire contents of which are hereby incorporated by reference.

BACKGROUND OF THE INVENTION

1. Field of the Invention

The present invention relates to a semiconductor memory device and, more particularly, it relates to readout technique in which a current flowing in a memory cell of a semiconductor memory device is detected and its storage state is determined at high speed.

2. Description of the Related Art

There are various kinds of methods of reading out a storage state of a memory cell in a semiconductor memory device. A description will be made with reference to a flash memory which is one of a nonvolatile semiconductor memory device. The flash memory comprises a memory transistor in a memory cell having a floating gate structure, in which information is stored according to an amount of charges (electrons) input to the floating gate of the memory cell. More specifically, in a state where there are many electrons in the floating gate, an inversion layer is not likely to be formed in a channel region, so that a threshold voltage of the memory cell becomes high (defined as a programming state). Meanwhile, in a state where the electrons are discharged from the floating gate, the inversion layer is likely to be formed in the channel region, so that the threshold voltage of the memory cell becomes low (defined as an erasing state). In order to determine whether the state of the selected memory cell is in the programming state or the erasing state at high speed, a reference memory cell having a middle threshold voltage between the programming state and the erasing state is input to a differential input type of sense amplifier circuit.

FIG. 8 shows a basic circuit constitution of a readout circuit in such memory cell (referred to as a conventional example 1 occasionally). The readout circuit shown in FIG. 8 comprises a bias voltage applying circuit 102 in which a predetermined bias voltage is applied to a memory cell 100 selected from memory cells as an object to be read and a reference memory cell 101 to supply a memory cell current flowing in the selected memory cell 100 and the reference memory cell 101 depending on their storage states. The bias voltage applying circuit 102 comprises a load circuit 103, and a bias adjustment circuit 104 which adjusts a bias voltage applied to the selected memory cell 100 and the reference memory cell 101. Therefore, the bias voltage is applied from a predetermined internal power supply voltage to bit lines Bmain and Bref of the selected memory cell 100 and the reference memory cell 101, respectively, through the load circuit 103 and the bias adjustment circuit 104, and reaches the selected memory cell 100 and the reference memory cell 101.

The bias voltage applying circuit 102 converts a memory cell current Imain according to the storage state of the selected memory cell 100 to a voltage level at a first output node Nout1, and converts a reference cell current Iref according to the storage state of the reference memory cell 101 to a voltage level at a second output node Nout2. A voltage difference between both output nodes is detected to determine the storage state of the selected memory cell 100 by a differential amplification type of sense amplifier 105 in a next stage. Therefore, in order to implement high-speed readout, it is necessary to provide a voltage difference across both output nodes sufficiently.

Although the load circuit 103 comprises a transistor in general as shown in the figure, it may be a resistive element instead of the transistor. However, in view of the above circumstances, as shown in the conventional example 1 in FIG. 8, a current-mirror type of load circuit 103 in which a relatively high gain can be provided in a simple structure is used in many cases in general. According to the conventional example 1, it comprises a P-channel MOSFET (referred to as a PMOS hereinafter).

However, as the memory capacity is increased, the number of memory cells to be connected to the bias voltage applying circuit 102 is increased, and electric capacity to be driven by the bias voltage applying circuit 102 tends to be increased. In addition, in view of demands for a readout operation at low voltage, it is necessary to implement the readout operation which is highly tolerant for noise at high speed. As measures for the above issue, it is proposed and implemented that the memory cell array is so constituted that the parasitic capacity of the bit line Bmain of the selected memory cell 100 may be equal to that of the bit line Bref of the reference memory cell 101, and the loads in both current paths are equalized, so that transient response characteristics in the readout operation is equalized.

More specifically, there is a method of speeding up the readout operation, in which the parasitic capacity connected to each input of the sense amplifier is equalized by connecting a bit line of the memory array block adjacent to a memory array block containing the selected memory cell to a bit line of the reference memory cell (for example, refer to JP-A 2003-77282, and D. Elmhurst et. al., "A 1.8V 128 Mb 125 MHz Multi-level Cell Flash Memory with Flexible Read While Write" ISSCC Digest of Technical Papers, pp. 286–287, February, 2003).

In the case of the constitution in which the parasitic capacity is equalized between the bit lines, one of the bit lines is connected to the selected memory cell and the other is connected to the reference memory cell, depending on an address of the selected memory cell (position in the memory array). When the current-mirror type of load circuit shown in FIG. 8 is used as the load circuit of the bias voltage applying circuit, since the constitution is not symmetric, it is designed such that readout performance is prevented from being lowered by the asymmetric characteristics. For example, according to a bias voltage applying circuit disclosed in JP-A 2003-77282 (referred to as the conventional example 2 occasionally hereinafter), as shown in FIG. 9, there is proposed a constitution in which selection transistors 200 are provided to control on/off of the selection transistor depending on an address of the selected memory cell, and the bit line of the selected memory cell is statically connected to one side of the asymmetric load circuit. In addition, according to a bias voltage applying circuit (referred to as the conventional example 3 occasionally hereinafter) disclosed in D. Elmhurst et. al., "A 1.8V 128 Mb 125 MHz Multi-level Cell Flash Memory with Flexible Read While Write" ISSCC Digest of Technical Papers, pp. 286–287, February, 2003, as shown in FIG. 10, there is proposed a constitution in which switch transistors 300 to switch the direction of the current mirror are provided, and one of the switch transistors 300 is turned on according to an address of a selected memory cell to connect a bit line of the selected memory cell to one side of the asymmetric load circuit statically.

However, according to the bias voltage applying circuit of the conventional example 2 shown in FIG. 9, since it is necessary to provide one additional selection transistor 200 to switch the right and left bit lines, an additional resistance component is added to a memory cell current path. As a result, CR (capacity resistance product) of the bit line is increased and the transient characteristics deteriorates, which could hinder the high-speed readout.

Furthermore, according to the bias voltage applying circuit in the conventional example 3 shown in FIG. 10, since the Vds (voltage between a drain and a source) of the PMOS switch transistor 300 becomes almost 0 V, its on resistance is increased and it takes time for a gate potential of the PMOS in the load circuit 103 to reach the same level as that of a drain potential. Therefore, the current mirror operation is not correctly performed for the above period, which could hinder the high-speed readout.

In addition, since the load circuit 103 is asymmetric in the bias voltage applying circuit in either the conventional example 2 or 3, the load capacity at an input node of the next-stage sense amplifier is varied, which could hinder the high-speed readout because of the difference in transient response characteristics.

SUMMARY OF THE INVENTION

The present invention has been made in view of the above problems and it is an object of the present invention to provide a bias voltage applying circuit in which the above problems in the asymmetric type of load circuit are solved, a high gain is provided in a perfectly symmetric type, high-speed and stable readout operation can be performed, and a semiconductor memory device comprising this bias voltage applying circuit.

In order to attain the above object, according to a first aspect of the present invention, a bias voltage applying circuit according to the present invention applies a predetermined bias voltage to each of a memory cell selected from a main memory array comprising a plurality of arranged memory cells and a reference memory cell, converts a memory cell current which flows depending on a storage state of each of the selected memory cell and the reference memory cell to a voltage level and outputs it. The bias voltage applying circuit comprises a first bias circuit which supplies a current to the selected memory cell, and a second bias circuit which supplies a current to the reference memory cell. Herein, each of the first bias circuit and the second bias circuit which have the same constitution comprises a first active element between a power supply node and a junction node, in which a current is controlled so as to prevent a voltage level at the junction node from fluctuating, a second active element between the power supply node and an output node, in which a current is controlled such that a voltage level at the output node is changed in the direction opposite to a voltage level at the junction node of the other side of the bias circuit, a third active element between the junction node and a current supply node, in which a current from the first active element is supplied to the selected memory cell or the reference memory cell, and a voltage level of the current supply node is controlled at a predetermined level, and a fourth active element between the output node and the current supply node, in which a current from the second active element is supplied to the selected memory cell or the reference memory cell, and a voltage level at the current supply node is controlled at a predetermined level.

Preferably, the bias voltage applying circuit according to the first aspect of the present invention is designed such that each of the first active element and the second active element comprises a P-channel MOSFET and, further, each of the third active element and the fourth active element comprises an N-channel MOSFET.

In the bias voltage applying circuit according to the first aspect of the present invention, since the first bias circuit which supplies the current to the selected memory cell and the second bias circuit which supplies the current to the reference memory cell have the same constitution, there is provided a perfectly symmetric circuit constitution, so that the problems in the conventional asymmetric type of load circuit can be solved. In addition, although the voltage level at the junction node is changed depending on the amount of the supplied memory cell current, since its amplitude is controlled to some extent by the first active element, following properties to the change in memory cell current is high. Meanwhile, since the change in controlled amplitude at the junction node on the other side appears as a voltage change at the output node on one side by the second active element, when the memory cell current on one side is larger than that on the other side, the voltage level at the junction node on the other side is higher and the current supply ability of the second active element is lowered, so that the voltage level at the output node on one side is lowered. At the same time, the current supply ability of the second active element on the other side is increased and the voltage level at the output node on the other side becomes high. Therefore, since the voltage difference between the output nodes of the two bias circuits is amplified largely corresponding to the current difference of the memory cell currents, a high gain can be provided. Furthermore, since the voltage level at the current supply node is controlled by the third and fourth active elements, there can be provided large voltage amplitude at the output node while the voltage amplitude at the current supply node is suppressed. That is, a high-speed readout operation can be performed by separating the high bit line capacity from the output node. On the contrary, when the memory cell current on one side is smaller than the memory cell current on the other, although the entirely reverse phenomenon is generated, the same result that the selected memory cell and the reference memory cell are reversed is provided. Therefore, even when the selected memory cell is connected to the bias circuit, the same high-speed readout operation can be performed.

According to a second aspect of the present invention, the bias voltage applying circuit according to the first aspect of the present invention is designed such that the first active element of the first bias circuit and the second active element of the second bias circuit are constituted by current mirror connection, and the first active element of the second bias circuit and the second active element of the first bias circuit are constituted by current mirror connection.

In the bias voltage applying circuit according to the second aspect of the present invention, since the bias voltage applying circuit according to the first aspect of the present invention is implemented basically, the same effect can be provided. More specifically, since there can be provided a high gain output in each differential output of the bias voltage applying circuit because of the current mirror connection, there can be provided a gain output further higher than the normal current mirror connection.

The bias voltage applying circuit according to the first or second aspect of the present invention is designed such that a current supply ability of the first active element is the same as that of the second active element, and a current supply ability of the third active element is the same as that of the fourth active element under the same bias condition. Alternatively, a current supply ability of the first active element is different from that of the second active element, and a current supply ability of the third active element is different from that of the fourth active element under the same bias condition. In the bias voltage applying circuit according to the present invention, a gain or transient response characteristics can be adjusted by adjusting the current supply abilities of the first active element and the second active element and adjusting the current supply abilities of the third active element and the forth active element.

According to a third aspect of the present invention, in addition to the first aspect of the present invention, the bias voltage applying circuit according to the present invention is further designed such that the first active element comprises a P-channel MOSFET in which a source is connected to the power supply node, and a gate and a drain are connected to the junction node, the second active element comprises a P-channel MOSFET in which a source is connected to the power supply node, a drain is connected to the output node, and a gate is connected to the junction node of the other side of the bias circuit, the third active element comprises an N-channel MOSFET in which a source is connected to the current supply node, a drain is connected to the junction node, and a predetermined middle voltage is supplied to a gate, and the fourth active element comprises an N-channel MOSFET in which a source is connected to the current supply node, a drain is connected to the output node, and the middle voltage is supplied to a gate.

In the bias voltage applying circuit according to the third aspect of the present invention, since the bias voltage applying circuit according to the first aspect of the present invention is implemented basically, the same effect can be provided. Further, since the bias voltage applying circuit according to the second aspect of the present invention is implemented basically, the same effect can be provided.

In order to attain the above object, according to a fourth aspect of a bias voltage applying circuit according to the present invention applies a predetermined bias voltage to each of a memory cell selected from a main memory array comprising a plurality of arranged memory cells and a reference memory cell, converts a memory cell current which flows depending on a storage state of each of the selected memory cell and the reference memory cell to a voltage level and outputs it. The bias voltage applying circuit comprises a first bias circuit which supplies a current to the selected memory cell, and a second bias circuit which supplies a current to the reference memory cell. Herein, each of the first bias circuit and the second bias circuit which have the same bias circuit constitution comprises a first active element between a first power supply node and an internal node, in which a voltage level at the internal node is prevented from fluctuating, a second active element between the internal node and a current supply node, in which a current from the first active element is supplied to the selected memory cell or the reference memory cell and a voltage level at the current supply node is controlled at a predetermined level, a third active element between the first power supply node and an output node, in which a current amount is changed in proportion to changes in current amount of the selected memory cell or the reference memory cell supplied from the current supply node, a fourth active element between a junction node and the output node, in which a current is controlled so as to prevent a voltage level at the output node from fluctuating, a fifth active element between a junction node and the output node, in which a current is controlled such that a voltage level at the output node is changed in the direction opposite to a voltage level at the output node of the other side of the bias circuit, and a sixth active element between a second power supply node and the junction node, which validates operations of the fourth active element and the fifth active element when the bias circuit is operated, and invalidates operations of the fourth active element and the fifth active element when the bias circuit is not operated, and the junction node of the first bias circuit is connected to the junction node of the second bias circuit.

Preferably, the bias voltage applying circuit according to the fourth aspect of the present invention is designed such that each of the first active element and the third active element comprises a P-channel MOSFET, and each of the second active element, the fourth active element, the fifth active element, and the sixth active element comprises an N-channel MOSFET.

Preferably, the bias voltage applying circuit according to the fourth aspect of the present invention is designed such that the fourth active element of the first bias circuit and the fifth active element of the second bias circuit are constituted by current mirror connection, the fourth active element of the second bias circuit and the fifth active element of the first bias circuit are constituted by current mirror connection, the first active element of the first bias circuit and the third active element of the first bias circuit are constituted by current mirror connection, and the first active element of the second bias circuit and the third active element of the second bias circuit are constituted by current mirror connection.

Preferably, the bias voltage applying circuit according to the fourth aspect of the present invention is designed such that a current supply ability of the fourth active element is the same as that of the fifth active element, and a current supply ability of the first active element is the same as that of the third active element under the same bias condition.

Preferably, the bias voltage applying circuit according to the fourth aspect of the present invention is designed such that the first active element comprises a P-channel MOSFET in which a source is connected to the first power supply node, and a gate and a drain are connected to the internal node, the second active element comprises an N-channel MOSFET in which a source is connected to the current supply node, a drain is connected to the internal node, and a predetermined middle voltage is supplied to a gate, the third active element comprises a P-channel MOSFET in which a source is connected to the first power supply node, a gate is connected to the internal node, and a drain is connected to the output node, the fourth active element comprises an N-channel MOSFET in which a source is connected to the junction node, and a gate and a drain are connected to the output node, the fifth active element comprises an N-channel MOSFET in which a source is connected to the junction node, a drain is connected to the output node, and a gate is connected to the output node of the other side of the bias circuit, and the sixth active element comprises an N-channel MOSFET in which a source is connected to the second power supply node, a drain is connected to the junction node, and a predetermined operation control voltage is supplied to a gate.

In order to attain the above object, according to a fifth aspect of another bias voltage applying circuit according to the present invention applies a predetermined bias voltage to each of a memory cell selected from a main memory array comprising a plurality of arranged memory cells and a reference memory cell, converts a memory cell current which flows depending on a storage state of each of the selected memory and the reference memory cell to a voltage level and outputs it. The bias voltage applying circuit comprises a first bias circuit which supplies a current to the selected memory cell, and a second bias circuit which supplies a current to the reference memory cell. Herein, each of the first bias circuit and the second bias circuit which have the same bias circuit constitution comprises a first active element between a first power supply node and an internal node, in which a voltage level at the internal node is prevented from fluctuating, a second active element between the internal node and a current supply node, in which a current from the first active element is supplied to the selected memory cell or the reference memory cell and a voltage level at the current supply node is controlled at a predetermined level, a third active element between the first power supply node and a first junction node, in which a current amount is changed in proportion to changes in current amount of the selected memory cell or the reference memory cell supplied from the current supply node, a fourth active element between the first power supply node and an output node, in which a current amount is changed in proportion to changes in current amount of the selected memory cell or the reference memory cell supplied from the current supply node, a fifth active element between the first junction node and a second junction node, in which a current is controlled so as to prevent a voltage level at the first junction node from fluctuating, a sixth active element between the second junction node and the output node, in which a current is controlled such that a voltage level at the output node is changed in the direction opposite to a voltage level at the output node of the other side of the bias circuit, and a seventh active element between a second power supply node and the second junction node which validates operations of the fifth active element and the sixth active element when the bias circuit is operated, and invalidates operations of the fifth active element and the sixth active element when the bias circuit is not operated, and the second junction node of the first bias circuit is connected to the second junction node of the second bias circuit.

Preferably, the bias voltage applying circuit according to the fifth aspect of the present invention is designed such that each of the first active element, the third active element and the fourth active element comprises a P-channel MOSFET, and each of the second active element, the fifth active element, the sixth active element and the seventh active element comprises an N-channel MOSFET and, also, that the first active element and the third active element are constituted by current mirror connection, the first active element and the fourth active element are constituted by current mirror connection, the fifth active element of the first bias circuit and the sixth active element of the second bias circuit are constituted by current mirror connection, and the fifth active element of the second bias circuit and the sixth active element of the first bias circuit are constituted by current mirror connection.

The bias voltage applying circuit according to the fifth aspect of the present invention is designed such that a current supply ability of the fifth active element may be the same as that of the sixth active element, and a current supply ability of the first active element may be the same as those of the third active element and the fourth active element under the same bias condition, or a current supply ability of the fifth active element may be the same as that of the sixth active element, a current supply ability of the third active element may be the same as that of the fourth active element, a current supply ability of the first active element may be different from that of the third active element, and a current supply ability of the first active element may be different from that of the fourth active element under the same bias condition, or a current supply ability of the fifth active element may be the same as that of the sixth active element, and a current supply ability of the third active element may be different from that of the fourth active element under the same bias condition.

Preferably, the bias voltage applying circuit according to the fifth aspect of the present invention is designed such that the first active element comprises a P-channel MOSFET in which a source is connected to the first power supply node, a gate and a drain are connected to the internal node, the second active element comprises an N-channel MOSFET in which a source is connected to the current supply node, a drain is connected to the internal node, and a predetermined middle voltage is supplied to a gate, the third active element comprises a P-channel MOSFET in which a source is connected to the first power supply node, a gate is connected to the internal node, and a drain is connected to the first junction node, the fourth active element comprises a P-channel MOSFET in which a source is connected to the first power supply node, a gate is connected to the internal node, and a drain is connected to the output node, the fifth active element comprises an N-channel MOSFET in which a source is connected to the second junction node, and a gate and a drain are connected to the first junction node, the sixth active element comprises an N-channel MOSFET in which a source is connected to the second junction node, a drain is connected to the output node, and a gate is connected to the output node of the other side of the bias circuit, and the seventh active element comprises an N-channel MOSFET in which a source is connected to the second power supply node, a drain is connected to a second junction node and a predetermined operation control voltage is supplied to a gate.

In order to achieve the above object, according to a first aspect of the present invention, a semiconductor memory device of the present invention comprises a main memory array comprising a plurality of memory cells arranged so as to form an array, reference memory cells, an address selection circuit which selects a particular memory cell from the main memory array, a bias voltage applying circuit which applies a predetermined bias voltage to a bit line connected to the memory cell selected by the address selection circuit and to a bit line connected to the reference memory cell, converts a memory cell current flowing in each of the selected memory cell and the reference memory cell depending on each storage state to a voltage level and outputs it, and a sense circuit which compares an output voltage in the selected memory cell with an output voltage in the reference memory cell from the bias voltage applying circuit, amplifies them and outputs a voltage corresponding to data stored in the selected memory cell. Herein, when the current supply node of either one of the first bias circuit or the second bias circuit in the bias voltage applying circuit is connected to the bit line of the selected memory cell, the current supply node of the other of the first bias circuit or the second bias circuit is connected to the bit line of the reference memory cell.

In the semiconductor memory device according to the first aspect of the present invention, there can be implemented a semiconductor memory device in which the effect of the bias voltage applying circuit according to the present invention is provided and high-speed readout operation can be performed.

According to a second aspect of the present invention, in addition to the first aspect of the present invention, the semiconductor memory device according to the present invention is designed such that the first bias circuit of the bias voltage applying circuit is constituted such that a current can be supplied to the memory cell selected from the memory cells in a first region of the main memory array, the second bias circuit of the bias voltage applying circuit is constituted such that a current can be supplied to the memory cell selected from the memory cells in a second region which is different from the first region in the main memory array, current supply to the selected memory cell in the first region by the first bias circuit, and current supply to the reference memory cell connected to the bit line in the second region by the second bias circuit are generated as one readout operation, and current supply to the selected memory cell in the second region by the second bias circuit, and current supply to the reference memory cell connected to the bit line in the first region by the first bias circuit are generated as another readout operation.

In the semiconductor memory device according to the second aspect of the present invention, it is not necessary to select the bias circuit connected by the address of the selected memory cell using a particular selection circuit, and there can be provided constant readout performance regardless of the position of the selected memory cell in the main memory array.

According to a third aspect of the present invention, in addition to the first and second characteristics, the semiconductor memory device according to the present invention is designed such that parasitic capacity of the bit line connected to the selected memory cell is the same as that of the bit line connected to the reference memory cell.

In the semiconductor memory device according to the third aspect of the present invention, the transient response characteristics in both bit lines on the selected memory side and the reference memory cell side can be prevented from fluctuating and high-speed readout operation can be implemented.

DESCRIPTION OF PREFERRED EMBODIMENTS

First Embodiment

A first embodiment of a semiconductor memory device and a bias voltage applying circuit according to the present invention (occasionally referred to as "inventive device" and "inventive circuit", respectively, hereinafter) will be described with respect to the accompanying drawings.

Figure 1:
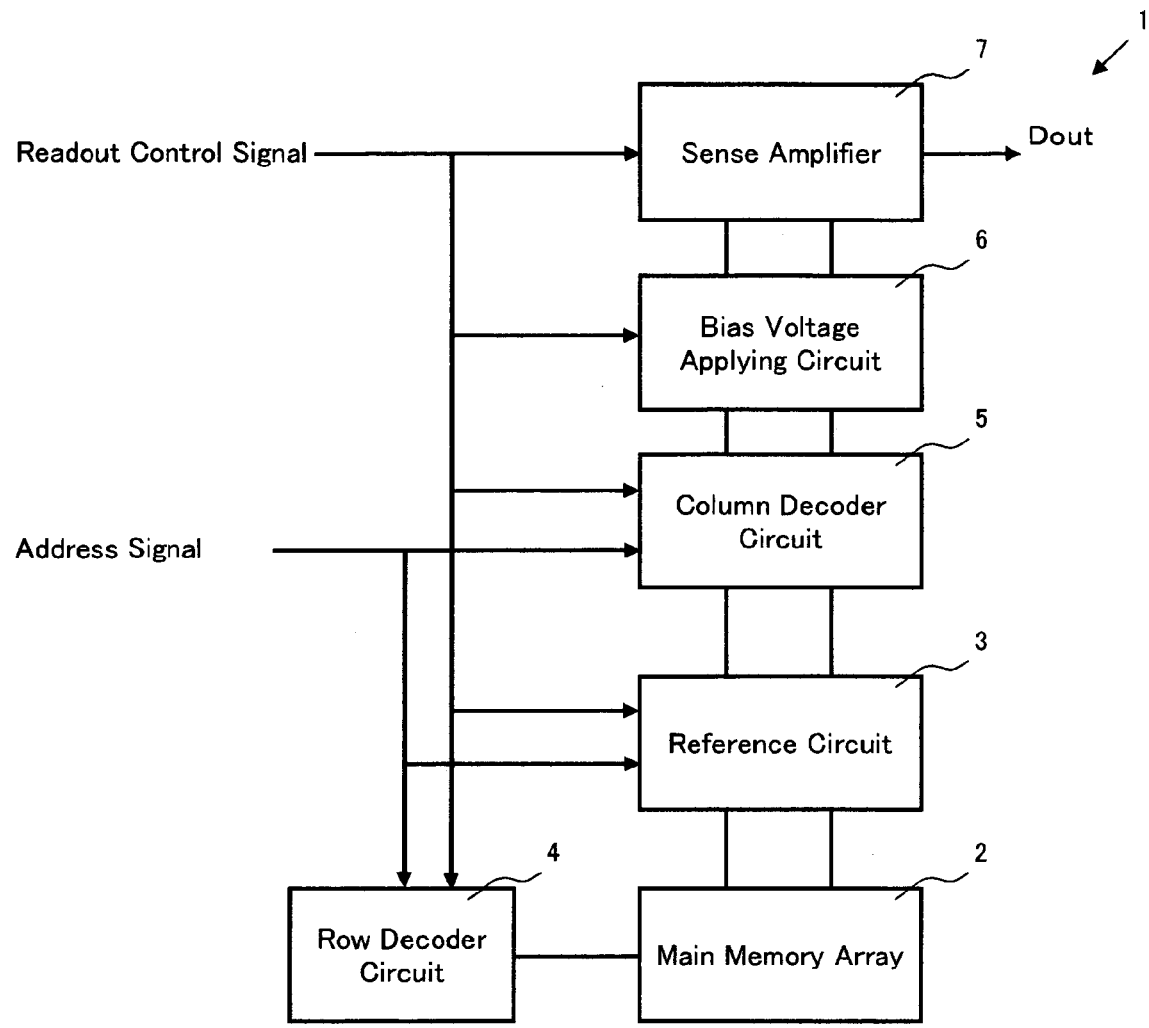
FIG. 1 is a block diagram showing a schematic constitution of a semiconductor memory device according to an embodiment of the present invention.

As shown in FIG. 1, an inventive device 1 comprises a main memory array 2, a reference circuit 3, a row decoder 4, a column decoder 5, a bias voltage applying circuit 6 according to the present invention, a sense amplifier 7 and the like. In addition, necessary address signal and a readout control signal (a chip enable signal, an output enable signal and the like) are input to each part through an input circuit although they are not shown. In addition, an output Dout of the sense amplifier 7 is output to an external circuit through a predetermined output circuit.

The main memory array 2 is so constituted that a plurality of memory cells to be read out are arranged in the row direction and the column direction in the form of an array. In this embodiment, it is assumed that a flash memory transistor having a floating gate type of FET structure is comprised in the memory cell so as to constitute a flash memory cell. Therefore, a storage state of the memory cell is determined by an amount of electrons stored in a floating gate and the storage state appears as a difference in threshold voltage of the memory transistor.

The reference circuit 3 comprises reference memory cells comprising flush memory cells having the same structure as that of the memory cells of the main memory array 2. In a case of a binary memory, the threshold voltage of the memory cell of the main memory array 2 is set at either a high threshold voltage or a low threshold voltage depending on 0/1 of the data, by a programming circuit of the flash memory to program the data. Therefore, although a memory cell current of the main memory array 2 is changed depending on its threshold voltage, a threshold voltage of the reference memory cell is adjusted at the time of testing so as to be a memory cell current at middle value between the two memory cell currents corresponding to the 0/1 of the data.

The row decoder 4 selects the memory cells in the main memory array 2 along the row direction and the column decoder 5 selects the memory cells in the main memory array 2 along the column direction, depending on an address signal input from the outside, so as to select the memory cell to be read out from the main memory array 2. The memory cell which is selected for the readout operation is referred to as the selected memory cell hereinafter.

Figure 2:
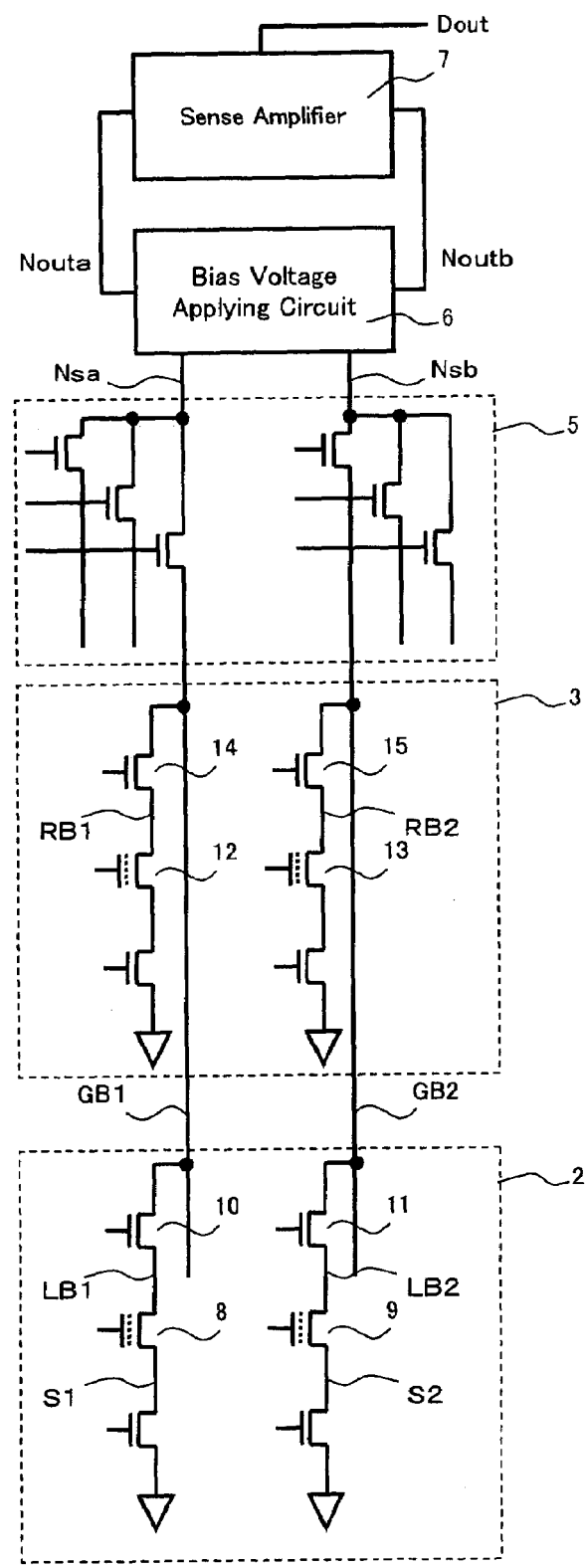
FIG. 2 is a block diagram showing a readout circuit system of the semiconductor memory device according to the embodiment of the present invention.

FIG. 2 shows a concrete example of connection relations among the main memory array 2, the reference circuit 3, the column decoder 5 and the inventive circuit 6. In FIG. 2, the main memory array 2 is divided into right and left storage regions. In addition, the reference circuit 3 is also divided into two like the main memory array 2. In this embodiment, the main memory array 2 employs a hierarchy bit line structure to implement a high packaging density of the memory cells. More specifically, the main memory array 2 is divided into a plurality of blocks along the bit line direction (column direction), and local bit lines LB1 and LB2 are provided in each block and drains of the plurality of memory cells 8 and 9 in the same column in the same block are connected to the local bit line LB1 and LB2 in parallel, to constitute a so-called NOR memory structure. In addition, only one memory cell is shown in the figure for simplification. The memory cell 8 and 9 in the same block is connected to the same source line S1 or S2 and the data in the same block can be erased at once. The local bit lines LB1 and LB2 are connected to global bit lines GB1 and GB2 through bit line selection transistors 10 and 11, respectively. The global bit lines GB1 and GB2 are connected to the plurality of blocks in the column direction. In this embodiment, the column decoder 5 selects one global bit line from the plurality of columns in each of the right and left storage regions to be connected to the inventive circuit 6. Here, when block of either right or left storage regions in the main memory array 2 is selected, the reference memory cell in the opposite region in the reference circuit 3 is selected. The selection of the block is controlled by on/off of the bit line selection transistors 10 and 11.

Although the reference circuit 3 is not divided into blocks in the column direction like the main memory array 2, it is so constituted that a current path from the inventive circuit 6 to the ground potential through the selected memory cell in the main memory array 2 and a current path from the inventive circuit 6 to the ground potential through the reference memory cell 12 or 13 of the reference circuit 3 may be equivalent at least in DC. Therefore, the reference circuit 3 comprises reference bit lines RB1 and RB2 corresponding to the local bit lines LB1 and LB2, respectively, in the main memory array 2, and reference bit line selection transistors 14 and 15 are provided between reference bit lines RB1 and RB2, and the global bit lines GB1 and GB2, respectively, so that the selection of the reference memory cell 12 or 13 can be controlled.

As the connection relation between the inventive circuit 6 and the selected memory cell or the reference memory cell in the main memory array 2 has been described above, a circuit constitution and a circuit operation of the inventive circuit 6 will be described next.

Figure 3:
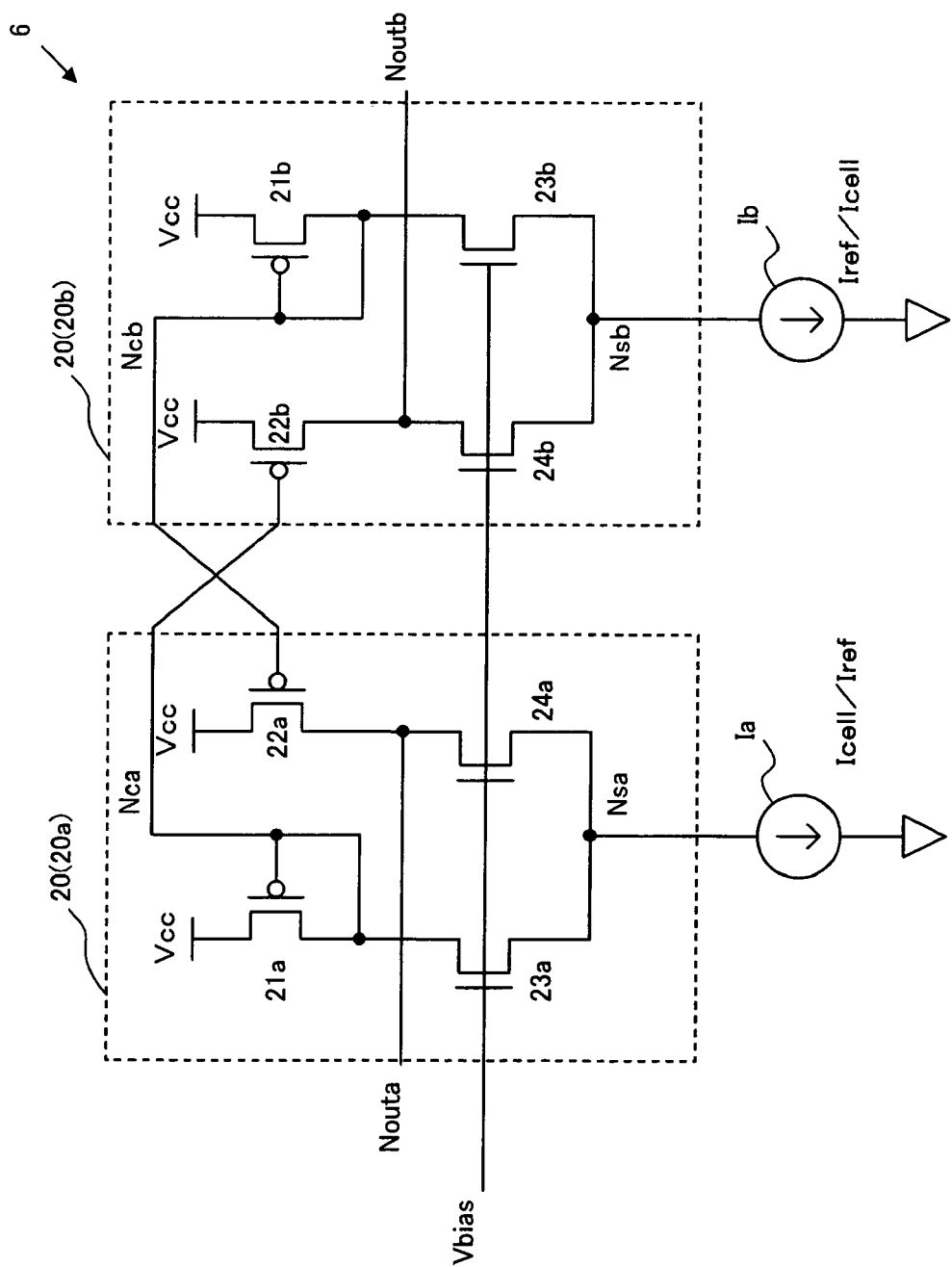
FIG. 3 is a circuit diagram showing a bias voltage applying circuit according to the embodiment of the present invention.

As shown in FIG. 3, the inventive circuit 6 comprises two bias circuits 20 which are entirely equivalent to each other. One of them is referred to as a first bias circuit 20a and the other is referred to as a second bias circuit 20b for convenience. In addition, one of two current sources Ia and Ib designates a memory cell current Icell of the selected memory cell and the other designates a memory cell current Iref of the reference memory cell in the figure. The memory cell current Icell of the selected memory cell is changed depending on the threshold voltage corresponding to the storage information.

The bias circuit 20a (20b) comprises four active elements comprising MOSFETs. A first active element 21a (21b) comprises a P-channel MOSFET (PMOS) in which a source is connected to a power supply node Vcc and a gate and a drain are connected to a junction node Nca (Ncb), a second active element 22a (22b) comprises a PMOS in which a source is connected to a power supply node Vcc, a drain is connected to an output node Nouta (Noutb), and a gate is connected to a junction node Ncb (Nca) of the other side of the bias circuit, a third active element 23a (23b) comprises an N-channel MOSFET (NMOS) in which a source is connected to a current supply node Nsa (Nsb), a drain is connected to the junction node Nca (Ncb) and a predetermined middle voltage Vbias is supplied to a gate, and a fourth active element 24a (24b) comprises an NMOS in which a source is connected to the current supply node Nsa (Nsb), a drain is connected to the output node Nouta (Noutb) and the middle voltage Vbias is supplied to a gate. In the above description, the reference signs in parentheses correspond to a description for the second bias circuit 20b.

Here, a current in the first active element 21a or 21b is controlled so as to prevent a voltage level of a drain voltage (at the junction node Nca or Ncb) from fluctuating, and a current of the second active element 22a or 22b is controlled such that a voltage level of a drain voltage (at the output node Nouta or Noutb) may be changed in the direction opposite to the voltage level at the junction node Ncb or Nca of the other side of the bias circuit 20.

More specifically, the first active element 21a of the first bias circuit 20a and the second active element 22b of the second bias circuit 20b are constituted by current mirror connection, and the first active element 21b of the second bias circuit 20b and the second active element 22a of the first bias circuit 20a are constituted by current mirror connection.

In addition, the third active element 23a or 23b supplies a current supplied from the first active element 21a or 21b to the selected memory cell or the reference memory cell, and controls the voltage level at the current supply node Nsa or Nsb at a predetermined level by setting the middle voltage Vbias. Similarly, the fourth active element 24a or 24b supplies a current from the second active element 22a or 22b to the selected memory cell or the reference memory cell, and controls the voltage level at the current supply node Nsa or Nsb at a predetermined level by setting of middle voltage Vbias.

In this embodiment, each transistor size (a gate length and a gate width) of the first active elements 21a and 21b and the second active elements 22a and 22b is the same and its current supplying ability under the same bias condition is the same. In addition, each transistor size of the third active elements 23a and 23b and the fourth active elements 24a and 24b is the same and its current supplying ability under the same bias condition is the same. As a result, each mirror ratio in the above current mirror connection is 1:1.

According to the inventive circuit 6, there is provided a perfectly symmetric circuit constitution even when the selected memory cell or the reference memory cell is connected to either the first bias circuit 20a or the second bias circuit 20b. More specifically, for example, the memory cell selected from the left storage region in the main memory array 2 is connected to the current supply node Nsa of the first bias circuit 20a and the memory cell selected from the right storage region in the main memory array 2 is connected to the current supply node Nsb of the second bias circuit 20b. However, when an address is selected so that the selected memory cell may be connected to the current supply node Nsa of the first bias circuit 20a, the reference memory cell in the right region in the reference circuit 3 is connected to the current supply node Nsb of the second bias circuit 20b. Alternatively, when an address is selected so that the selected memory cell may be connected to the current supply node Nsb of the second bias circuit 20b, the reference memory cell in the left region in the reference circuit 3 is connected to the current supply node Nsa of the first bias circuit 20a.

Figure 4:
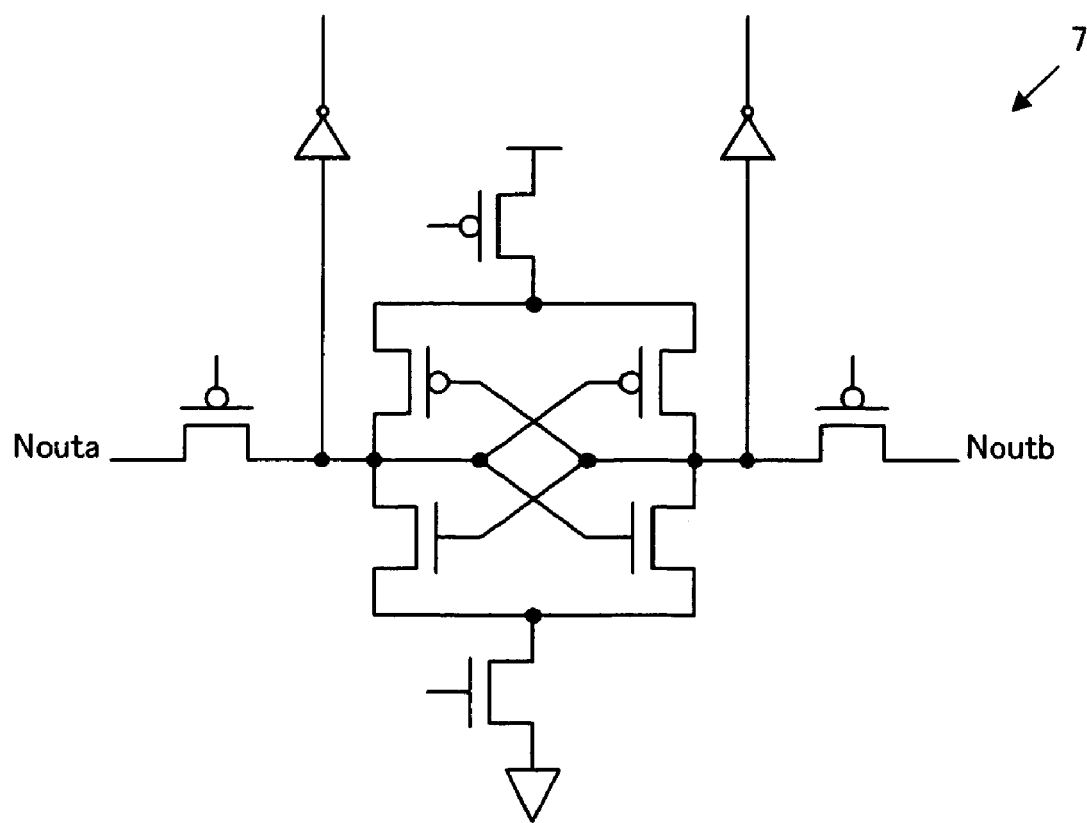
FIG. 4 is a circuit diagram showing an example of a sense amplifier which can be used in the semiconductor memory device according to the present invention.

Next, the sense amplifier 7 of the inventive device 1 will be described in brief. The sense amplifier 7 comprises a differential amplifier shown in FIG. 4, and two output nodes Nouta and Noutb of the inventive circuit 6 are connected to inputs of the sense amplifier 7. Although a dynamic type of circuit having a latching function shown in FIG. 4 is used as the sense amplifier 7 in this embodiment, the circuit constitution of the sense amplifier 7 is not limited to the constitution shown in FIG. 4.

Next, a circuit operation of the inventive circuit 6 will be described with reference to a voltage waveform graph in a circuit simulation (transient response simulation) in FIG. 5. In addition, according to this embodiment, an equalization transistor which temporally conducts to equalize the global bit lines GB1 and GB2 is provided between the global bit lines GB1 and GB2 which are connected to the current supply nodes Nsa and Nsb, respectively, in the inventive circuit 6 through the column decoder 5. Therefore, although the inventive circuit 6 starts the operation while the equalizing operation of the global bit lines GB1 and GB2 (when an equalization signal EQ is at high level in FIG. 5), since the potentials of both global bit lines GB1 and GB2 are the same during the equalizing operation, a current difference between the memory cell current Icell of the selected memory cell and the memory cell current Iref of the reference memory cell does not appear as a current difference supplied from the bias circuits 20a and 20b. As a result, a voltage difference between the output nodes Nouta and Noutb in the inventive circuit 6 does not appear.

Figure 5:
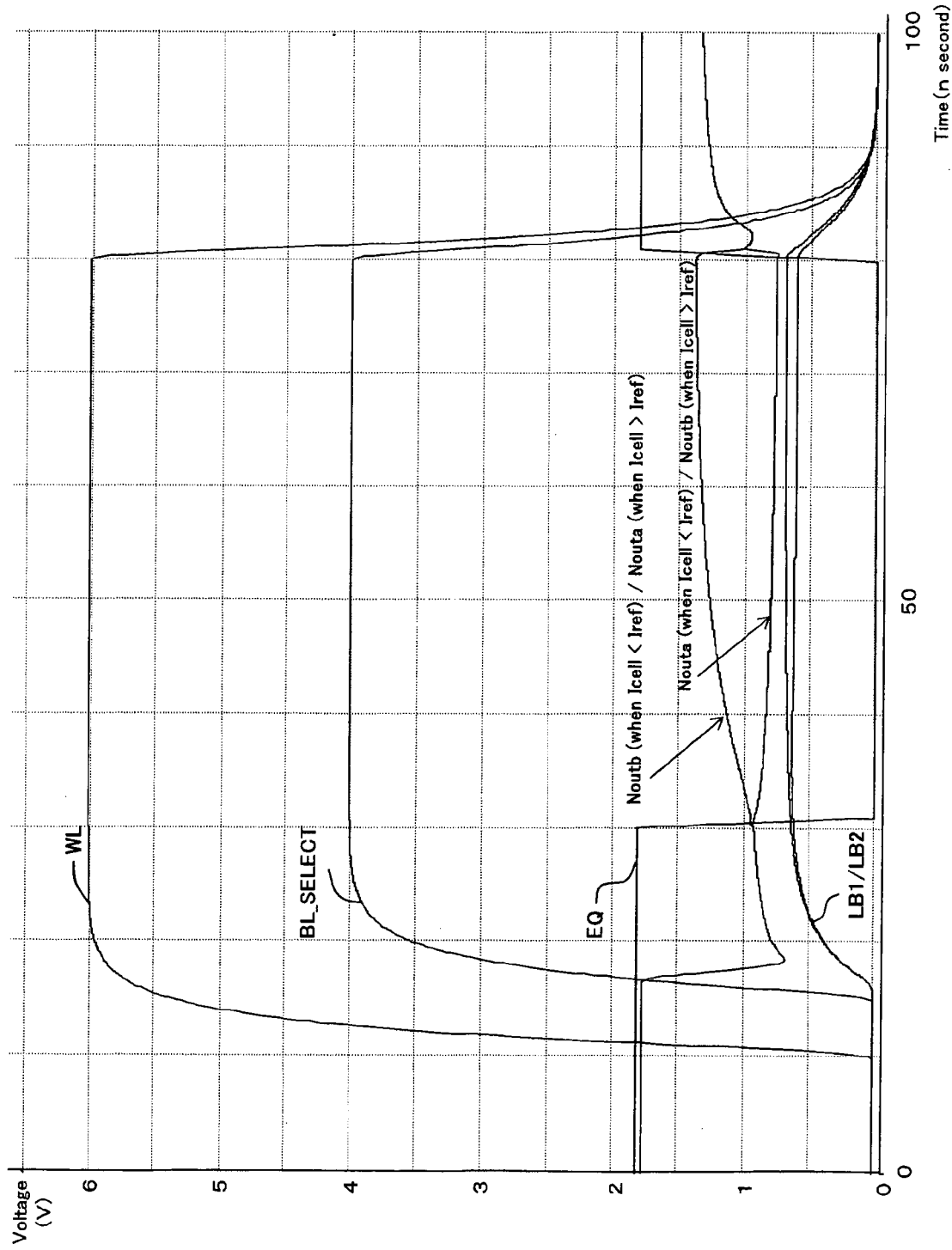
FIG. 5 is a voltage waveform graph of a circuit simulation result showing a circuit operation of the bias voltage applying circuit according to the present invention.

Referring to the voltage waveform of FIG. 5, the equalization signal EQ transits to the high level to start the equalizing operation. Then, a word line WL input to a control gate of the selected memory cell is selected by the row decoder 4 depending on an input level of an address signal, and a voltage of the selected word line WL rises and the memory cells are selected along the row direction. At the same time, a voltage level input to a control gate of the reference memory cell rises and the reference memory cell is selected by the reference circuit 3 depending on the input level of the address signal. Then, a bit line selection signal BLselect transits to the high level so as to turn on the bit line selection transistor 10 or 11 in order to select the local bit line LB1 or LB2 connected to the selected memory cell and connect it to the global bit line GB1 or GB2. At the same time, a predetermined selection signal transits to the high level so as to turn on the reference bit line selection transistor 14 or 15 of the reference circuit 3.

When the global bit line is connected to the local bit line and the reference bit line, a current path from the bias circuit 20a or 20b of the inventive circuit 6 to the selected memory cell and the reference memory cell is formed and the voltages of the local bit line and the reference bit line start to rise and, at the same time, the voltages at the output nodes Nouta and Noutb of the inventive circuit 6 drop because of a voltage drop by the second active element of the inventive circuit 6. However, since the equalizing operation is being performed, the voltage difference between both output nodes is 0 V. After the local bit line and the reference bit line are selected, when the equalization signal EQ transits to a low level and the equalizing operation is completed, a voltage difference corresponding to each memory cell current Icell or Iref of the selected memory cell and the reference memory cell is generated between the output nodes Nouta and Noutb because the global bit lines GB1 and GB2 are no longer in a short-circuit state. Although the voltages of the output nodes Nouta and Noutb are designed such that one is high and the other is low depending on the storage state of the selected memory cell; however, its voltage difference is constant regardless of the storage state of the selected memory cell. That is, there is no difference in readout speed when data "1" is read out and when data "0" is read out. In addition, although the selected memory cell is connected either the first bias circuit 20a or the second bias circuit 20b depending on the address of the selected memory cell, readout characteristics are not changed regardless of the address.

Figure 6:
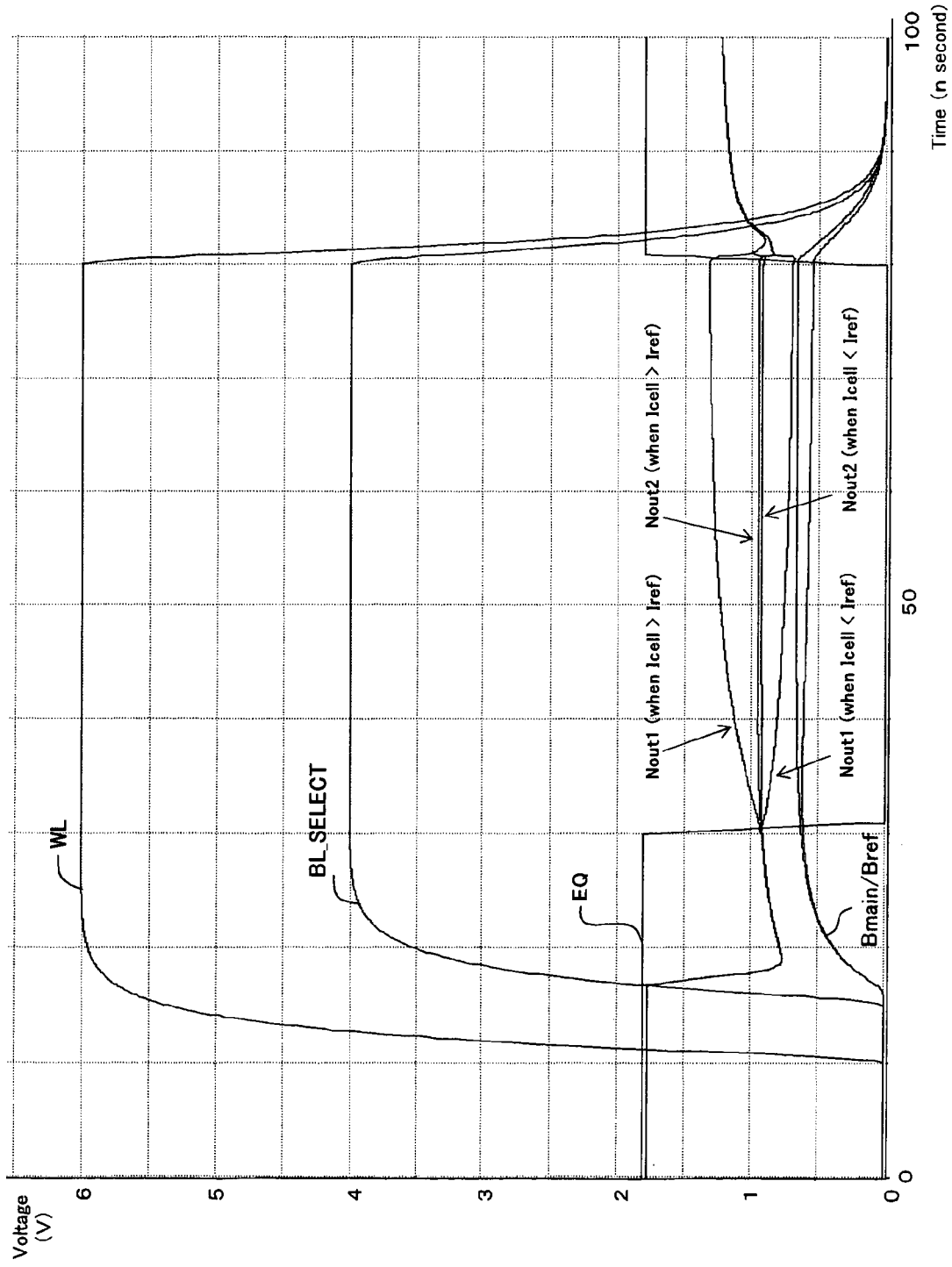
FIG. 6 is a voltage waveform graph of a circuit simulation result showing a circuit operation of a bias voltage applying circuit according to a conventional example shown in FIG. 8.
Figure 8:
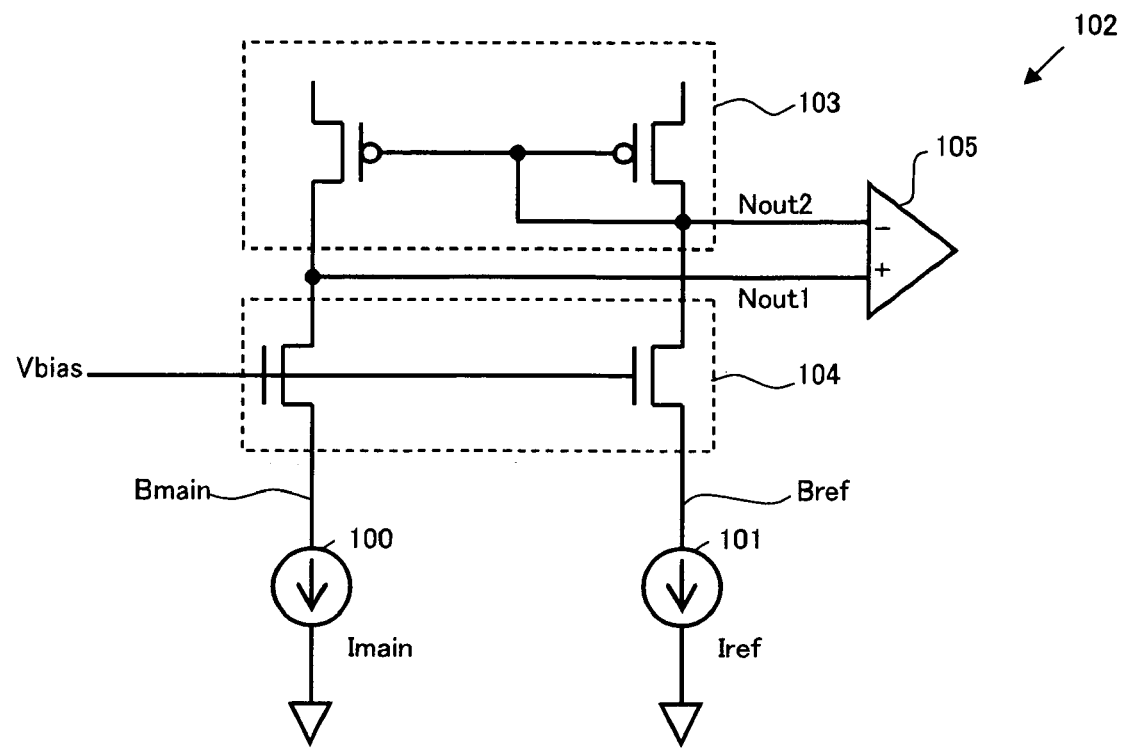
FIG. 8 is a circuit diagram showing one example of a current mirror type of bias voltage applying circuit in a conventional flash memory.
Figure 9:
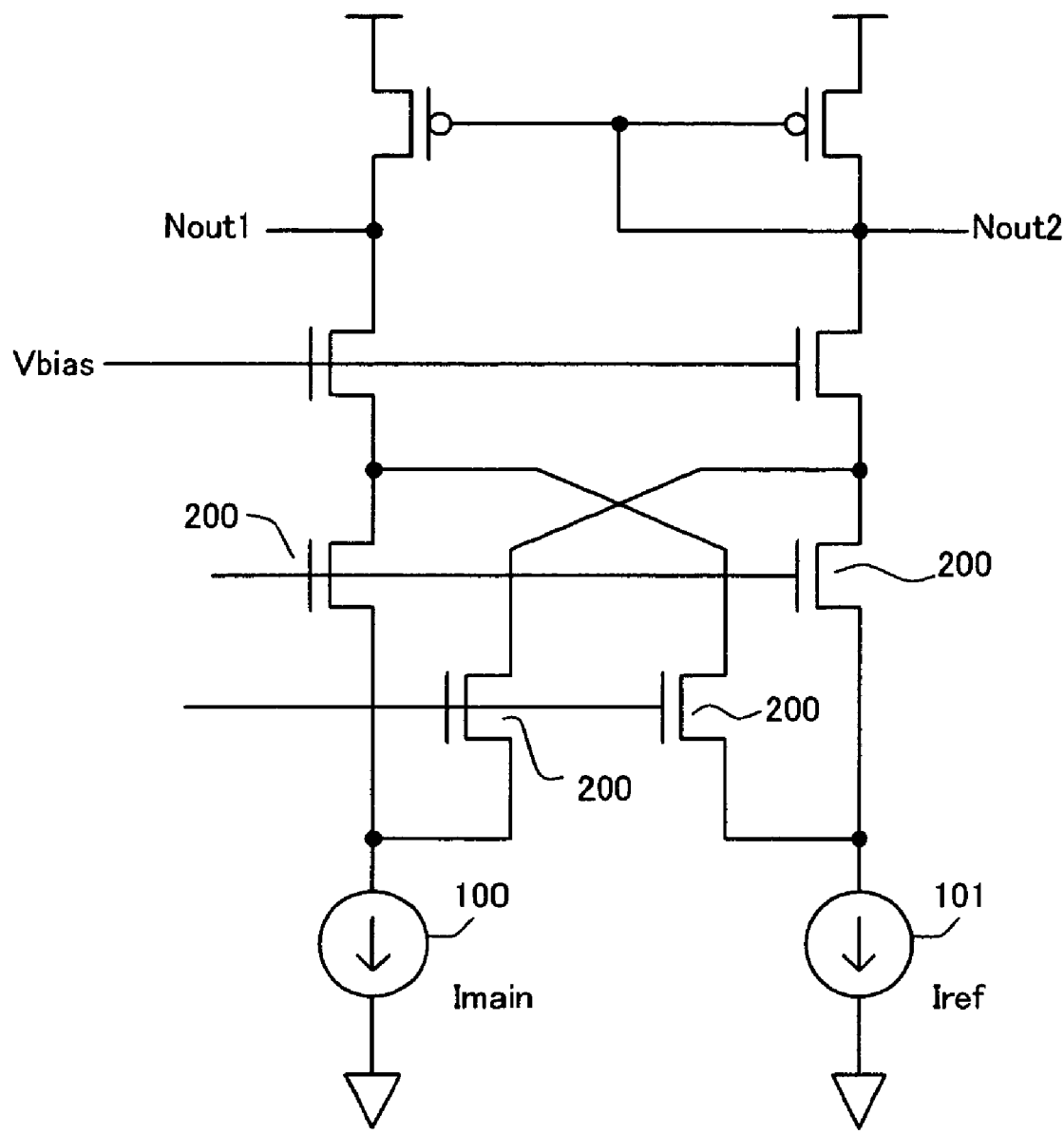
FIG. 9 is a circuit diagram showing an improved example of the current mirror type of bias voltage applying circuit in the conventional flash memory.
Figure 10:
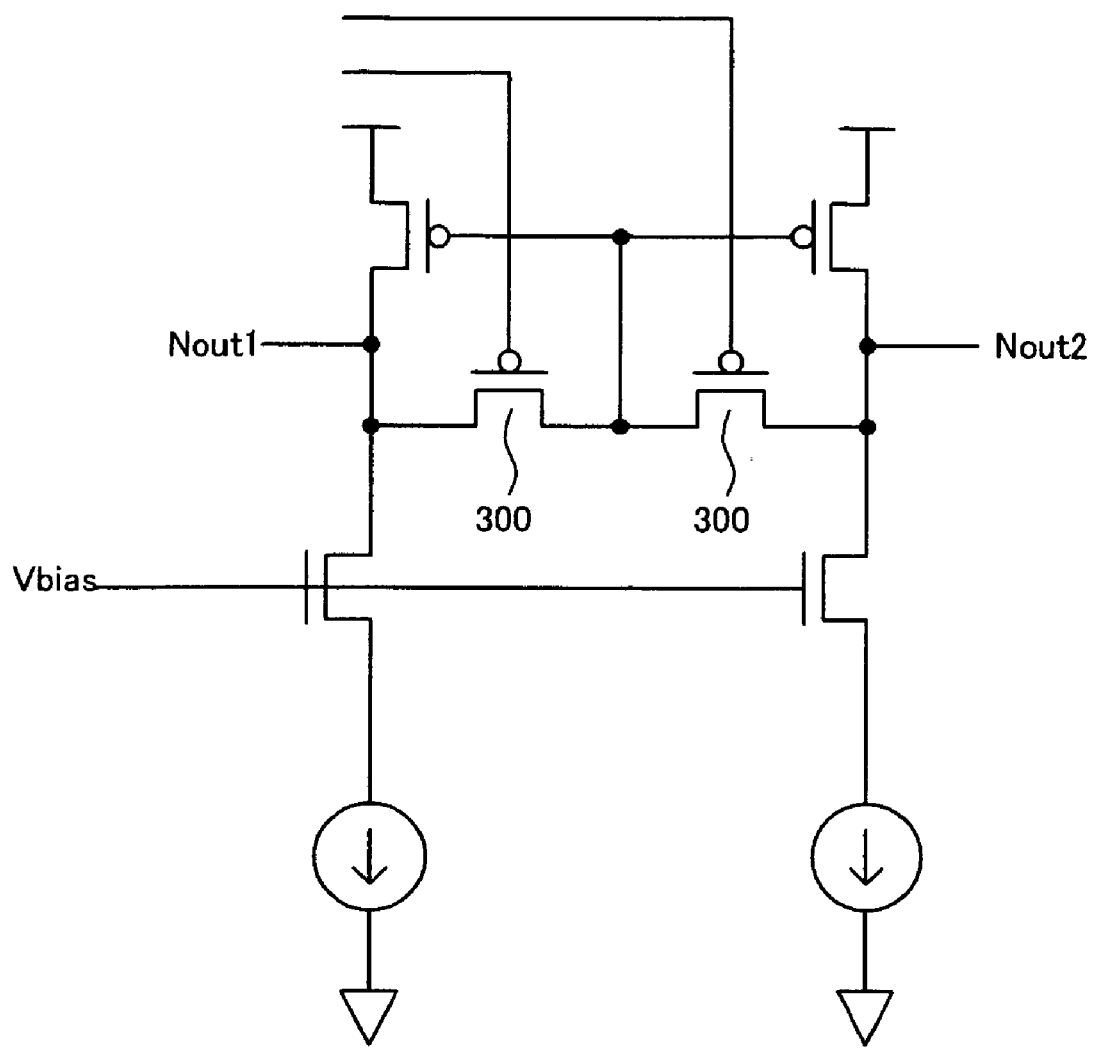
FIG. 10 is a circuit diagram showing another improved example of the current mirror type of bias voltage applying circuit in the conventional flash memory.

FIG. 6 shows a result when the circuit simulation was performed under the same condition for the bias voltage applying circuit according to the conventional example 1 shown in FIG. 8. As can be clear from FIG. 6, in the normal current mirror type of bias voltage applying circuit in the conventional example 1, the voltages at the output nodes Nouta and Noutb are largely varied and its voltage difference is varied depending on the storage state of the selected memory cell or depending on which current supply node is connected to the selected memory cell. As a result, a difference in readout characteristics is generated depending on the case the data "1" is read out or the data "0" is read out, so that an operation margin and a readout speed is lowered when one data is read.

As can be seen from the above description, when the bias voltage is applied to the selected memory cell and the reference memory cell using the inventive circuit 6, the data can be read out stably at high speed.

Second Embodiment

Next, a circuit constitution and a circuit operation of a semiconductor memory device according to a second embodiment of the present invention will be described with reference to the drawings.

Figure 11:
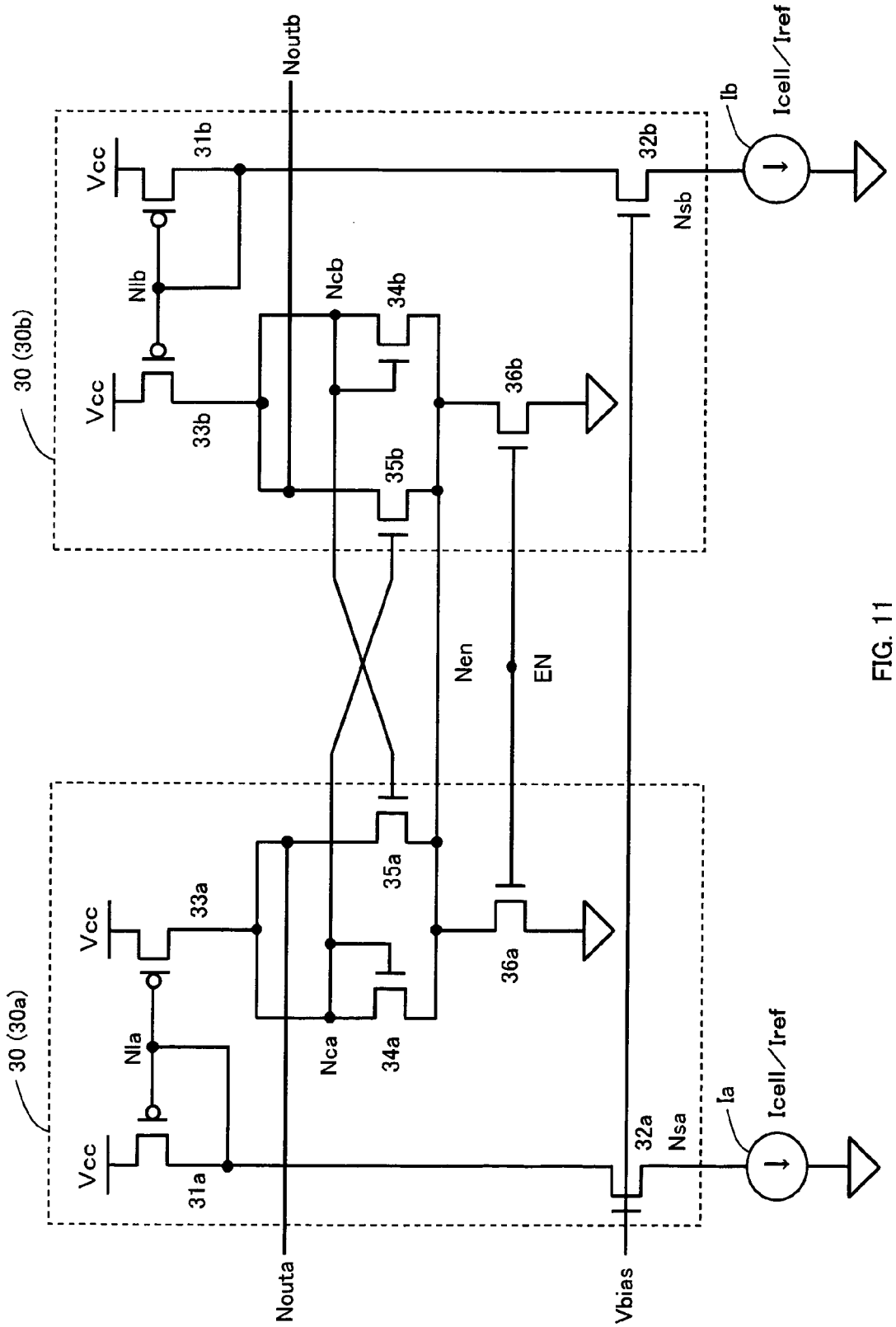
FIG. 11 is a circuit diagram showing a bias voltage applying circuit according to a second embodiment of the present invention.

As shown in FIG. 11, an inventive circuit 6 of this embodiment comprises two bias circuits 30 which are entirely equivalent to each other. Similar to the first embodiment, one of them is referred to as a first bias circuit 30a and the other is referred to as a second bias circuit 30b for convenience. In addition, similar to the first embodiment, one of two current sources Ia and Ib designates a memory cell current Icell of the selected memory cell and the other designates a memory cell current Iref of the reference memory cell. The memory cell current Icell of the selected memory cell is changed depending on the threshold voltage corresponding to the storage information.

The bias circuit 30a (30b) of this embodiment comprises six active elements comprising MOSFETs. A first active element 31a (31b) comprises a PMOS in which a source is connected to a first power supply node Vcc and a gate and a drain are connected to an internal node N1a (N1b). A second active element 32a (32b) comprises an NMOS in which a source is connected to a current supply node Nsa (Nsb), a drain is connected to the internal node N1a (N1b) and a middle voltage Vbias is supplied to a gate. A third active element 33a (33b) comprises a PMOS in which a source is connected to the first power supply node Vcc, a gate is connected to the internal node N1a (N1b) and a drain is connected to an output node Nouta (Noutb). A fourth active element 34a (34b) comprises an NMOS in which a source is connected to a junction node Nen, and a gate and a drain are connected to a junction node Nca (Ncb). A fifth active element 35a (35b) comprises an NMOS in which a source is connected to the junction node Nen, a drain is connected to the output node Nouta (Noutb) and a gate is connected to a junction node Ncb (Nca) of the other side of the bias circuit 30. A sixth active element 36a (36b) comprises an NMOS in which a source is connected to a second power supply node Vss, a drain is connected to the junction node Nen and an input signal EN which becomes Vcc when the bias circuit is operated and becomes Vss when it is not operated is supplied to a gate. In the above description, the reference signs in parentheses correspond to a description for the second bias circuit 30*b*. The second power supply node Vss is fixed to the ground potential in this embodiment.

Herein, a current in the first active element is controlled so as to prevent a voltage level at the internal node N1*a* from fluctuating. The second active element 32*a* or 32*b* supplies a current from the first active elements 31*a* and 31*b* to the selected memory cell or the reference memory cell, and controls the voltage level of the current supply nodes Nsa or Nsb at a predetermined level by setting the middle voltage Vbias.

In addition, the third active elements 33*a* and 33*b,* and the first active elements 31*a* and 31*b* are constituted by current mirror connection, respectively, so that a current amount flowing in the third active element 33*a* and a current amount flowing in the first active element 31*a* are controlled so as to be equivalent to each other, and a current amount flowing in the third active element 33*b* and a current amount flowing in the first active element 31*b* are also controlled so as to be equivalent to each other.

Herein, a current in the fourth active element 34*a* or 34*b* is controlled so as to prevent a voltage level of a drain voltage (at the output node Nouta or Noutb) from fluctuating, and a current of the fifth active element 35*a* or 35*b* is controlled such that a voltage level of a drain voltage (at the output node Nouta or Noutb) may be changed in the direction opposite to the voltage level at the output node Nouta or Noutb of the other side of the bias circuit 30. More specifically, the fourth active element 34*a* of the first bias circuit 30*a* and the fifth active element 35*b* of the second bias circuit 30*b* are constituted by current mirror connection, and the fourth active element 34*b* of the second bias circuit 30*b* and the fifth active element 35*a* of the first bias circuit 30*a* are constituted by current mirror connection.

The sixth active element 36*a* or 36*b* causes a short-circuit across the junction node Nen and the second power supply node Vss when the gate voltage becomes Vcc while this bias circuit is operated to validate the operations of the fourth active element 34*a* or 34*b* and the fifth active element 35*a* or 35*b*. When the bias circuit is not operated, the gate voltage becomes Vss and the junction node Nen and the second power supply node Vss are separated, so that the operations of the fourth active element 34*a* or 34*b* and the fifth active element 35*a* or 35*b* are invalidated.

According to the inventive circuit 6 of this embodiment, each transistor size (a gate length and a gate width) of the first active elements 31*a* and 31*b* and the third active elements 33*a* and 33*b* is the same. In addition, each transistor size of the second active elements 32*a* and 32*b* is the same, and each transistor size of the fourth active elements 34*a* and 34*b* and the fifth active elements 35*a* and 35*b* is the same. Furthermore, each transistor size of the sixth active elements 36*a* and 36*b* is the same. As a result, according to the inventive circuit 6 of this embodiment, each mirror ratio in the above current mirror connection between the first active elements 31*a* and 31*b*, and the third active elements 33*a* and 33*b*, and between the fourth active elements 34*a* and 34*b*, and the fifth active elements 35*a* and 35*b* is 1:1.

According to the inventive circuit 6 of this embodiment, there is provided a perfectly symmetric circuit constitution even when the selected memory cell or the reference memory cell is connected to either the first bias circuit 30*a* or the second bias circuit 30*b*. More specifically, for example, it is expected that the same amount of the memory cell current Icell or the reference memory cell current Iref as that of the memory cell current Icell or the reference memory cell current Iref in the bias circuit 20 of the first embodiment can flow by connecting the selected memory cell in the main memory array 2 like in the first embodiment to set the voltage at the current supply nodes Nsa and Nsb at the same voltage of the Nsa and Nsb of the bias circuit 20 in the first embodiment, respectively. Then, this current is copied from the first active element to the third active element by the current mirror connection and when this current is input to the current mirror connection consisting of the fourth active element and the fifth active element, a potential difference corresponding to the memory cell current Icell and the reference memory cell current Iref is generated between the output nodes Nouta and Noutb.

An upper limit of a voltage amplification width of the output node Nouta or Noutb in this embodiment is almost Vcc when the difference between the memory cell current Icell and the reference memory cell current Iref is large. A lower limit thereof is about Vss when the memory cell current Icell or the reference memory cell current Iref is zero. Herein, an upper limit of the voltage amplification width of the output node Nouta or Noutb in the inventive circuit 6 of the first embodiment is Vcc when the memory cell current Icell or the reference memory cell current Iref is zero (0 A). In addition, its lower limit becomes a voltage of the nodes Nsa or Nsb corresponding to the drain of the memory cell or the reference memory cell. Therefore, according to this embodiment, when the power supply voltage is set low especially, there can be provided an output current having an amplitude required for performing a readout operation with appropriate sensitivity, and there can be provided a larger output potential difference.

Furthermore, although the voltage of the output node Nouta or Noutb of the inventive circuit 6 is input to the sense amplifier which is the next-stage circuit, as the input potential difference at this time is larger, the operation of the sense amplifier can be performed more stably at higher speed. However, in view of recent tendency to low power supply voltage, when the difference between the voltage at the current supply node Nsa or Nsb and the power supply voltage becomes small, the voltage range at the output node Nouta or Noutb tends to become narrower. According to the inventive circuit 6 of this embodiment, as the larger output can be provided, an adverse affect caused when the difference between the voltage of the current supply node Nsa or Nsb and the power supply voltage becomes small can be reduced, and the operation of the next-stage sense amplifier can be stably performed. Therefore, according to the inventive circuit 6 of this embodiment, the voltage difference between the output nodes Nouta and Noutb can be largely provided without lowering sensitivity of the readout operation, and even when it is applied to the circuit of low power supply voltage specification, it is not affected by the voltage at the current supply node Nsa or Nsb.

In addition, according to this embodiment, the voltage difference between the output nodes Nouta and Noutb is constant regardless of the storage state of the selected memory cell like in the first embodiment. That is, there is no difference in readout speed when data "1" is read out or when data "0" is read out.

Third Embodiment

Next, a circuit constitution and a circuit operation of a semiconductor memory device according to a third embodiment of the present invention will be described with reference to the drawings. Although the current path of the memory cell current Icell or the reference memory cell current Iref which was copied from the first active element to the third active element is divided in the second embodiment, a current path is not divided in this embodiment and a current is copied from a first active element to a third active element and a fourth active element.

Figure 12:
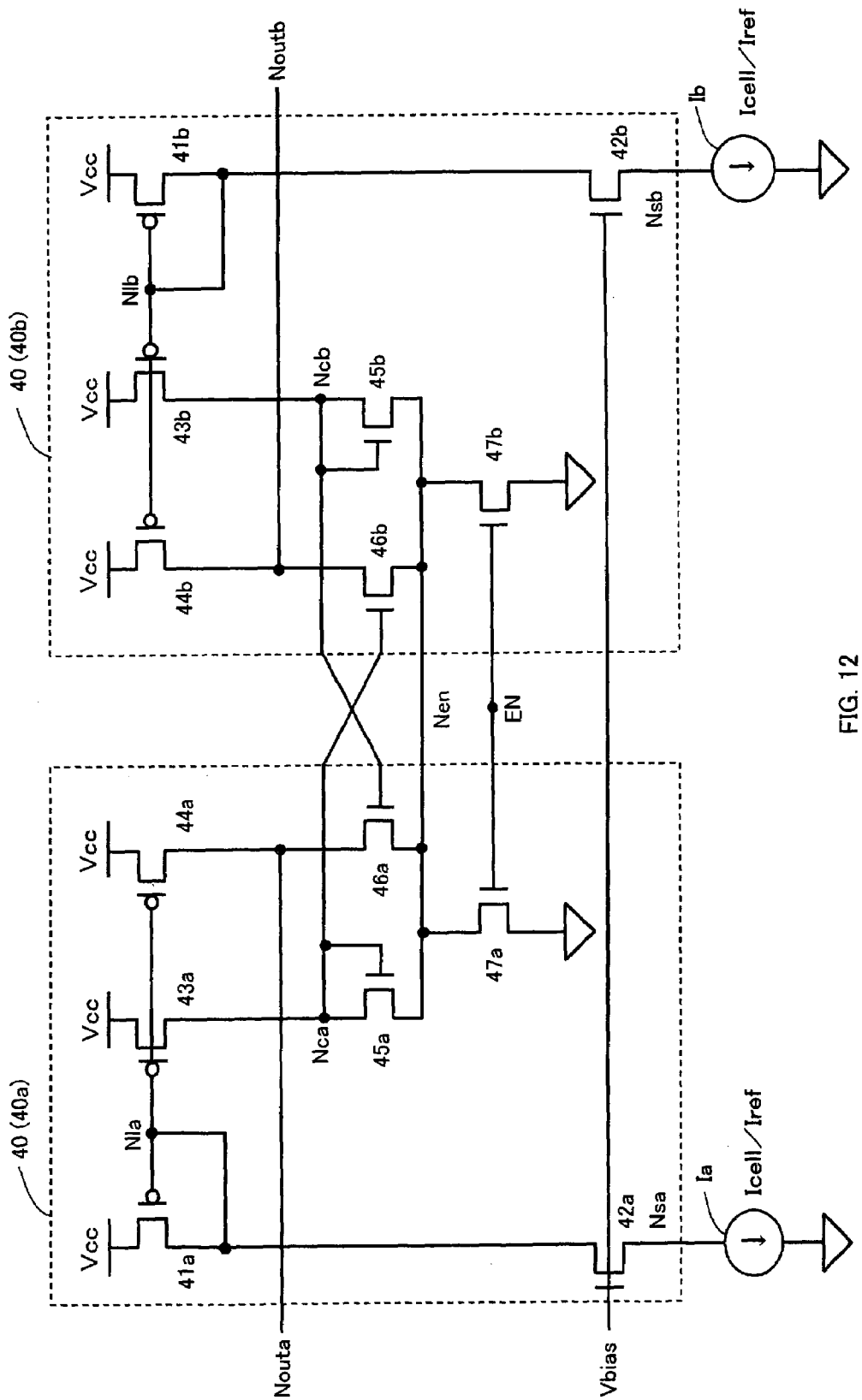
FIG. 12 is a circuit diagram showing a bias voltage applying circuit according to a third embodiment of the present invention.

As shown in FIG. 12, an inventive circuit 6 of this embodiment comprises two bias circuits 40 which are entirely equivalent to each other. Similar to the first and second embodiments, one of them is referred to as a first bias circuit 40a and the other is referred to as a second bias circuit 40b for convenience. In addition, similar to the first and second embodiments, one of two current sources Ia and Ib designates a memory cell current Icell of the selected memory cell and the other designates a memory cell current Iref of the reference memory cell in the figure. The memory cell current Icell of the selected memory cell is changed depending on the threshold voltage corresponding to storage information.

The bias circuit 40a (40b) of this embodiment comprises seven active elements comprising MOSFETs. A first active element 41a (41b) comprises a PMOS in which a source is connected to a first power supply node Vcc and a gate and a drain are connected to an internal node N1a (N1b). A second active element 42a (42b) comprises an NMOS in which a source is connected to a current supply node Nsa (Nsb), a drain is connected to the internal node N1a (N1b) and a middle voltage Vbias is supplied to a gate. A third active element 43a (43b) comprises a PMOS in which a source is connected to a first power supply node Vcc, a gate is connected to the internal node N1a (N1b) and a drain is connected to a junction node Nca (Ncb). A fourth active element 44a (44b) comprises a PMOS in which a source is connected to the first power supply node Vcc, a gate is connected to the internal node N1a (N1b) and a drain is connected to an output node Nouta (Noutb). A fifth active element 45a (45b) comprises an NMOS in which a source is connected to a junction node Nen and a gate and a drain are connected to the junction node Nca (Ncb). A sixth active element 46a (46b) comprises an NMOS in which a source is connected to the junction node Nen, a drain is connected to the output node Nouta (Noutb) and a gate is connected to an output node Ncb (Nca) of the other side of the bias circuit 40. A seventh active element 47a (47b) comprises an NMOS in which a source is connected to a second power supply node Vss, a drain is connected to the junction node Nen, and an input signal EN which becomes Vcc when the bias circuit is operated and becomes Vss when it is not operated is supplied to a gate. In the above description, the reference signs in parentheses correspond to a description for the second bias circuit 40b. The second power supply node Vss is fixed to the ground potential in this embodiment.

Herein, a current in the first active element 41a or 41b is controlled so as to prevent a voltage level at the internal node N1a from fluctuating. The second active element 42a or 42b supplies a current from the first active element 41a or 41b to the selected memory cell or the reference memory cell and controls the voltage level of the current supply node Nsa or Nsb at a predetermined level by setting the middle voltage Vbias.

In addition, each of the third active element 43a or 43b and the fourth active element 44a or 44b are constituted to be connected to the first active element 41a or 41b by current mirror connection, so that current amounts flowing in the first active element 41a, the third active element 43a and the fourth active element 44a are controlled so as to be equivalent, and current amounts flowing in the first active element 41b, the third active element 43b and the fourth active element 44b are also controlled so as to be equivalent.

Herein, a current in the fifth active element 45a or 45b is controlled so as to prevent a voltage level of a drain voltage (at the junction node Nca or Ncb) from fluctuating, and a current of the sixth active element 46a or 46b is controlled such that a voltage level of a drain voltage (at the output node Nouta or Noutb) may be changed in the direction opposite to the voltage level at the output node Nouta or Noutb of the other side of the bias circuit 40. More specifically, the fifth active element 45a of the first bias circuit 40a and the sixth active element 46b of the second bias circuit 40b are constituted by current mirror connection, and the fifth active element 45b of the second bias circuit 40b and the sixth active element 46a of the first bias circuit 40a are constituted by current mirror connection.

The seventh active element 47a or 47b causes a short-circuit across the junction node Nen and the second power supply node Vss when the gate voltage becomes Vcc while this bias circuit is operated to validate the operations of the fifth active element 45a or 45b and the sixth active element 46a or 46b. When the bias circuit is not operated, the gate voltage becomes Vss and the junction node Nen and the second power supply node Vss are separated, so that the operations of the fifth active element 45a or 45b and the sixth active element 46a or 46b are invalidated.

According to the inventive circuit 6 of this embodiment, each transistor size (a gate length and a gate width) of the first active elements 41a and 41b, the third active elements 43a and 43b and the fourth active elements 44a and 44b is the same. In addition, each transistor size of the second active elements 42a and 42b is the same, and each transistor size of the fifth active elements 45a and 45b and the sixth active elements 46a and 46b is the same. Furthermore, each transistor size of the seventh active elements 47a and 47b is the same. As a result, according to the inventive circuit 6 of this embodiment, each mirror ratio in the above current mirror connection between the first active element and the third active element, between the first active element and the fourth active element, and between the fifth active element and the sixth active element is 1:1.

According to the inventive circuit 6 of this embodiment, there is provided a perfectly symmetric circuit constitution even when the selected memory cell or the reference memory cell is connected to either the first bias circuit 40a or the second bias circuit 40b. More specifically, for example, it is expected that the same amount of the memory cell current Icell or the reference memory cell current Iref as the memory cell current Icell or the reference memory cell current Iref in the bias circuit 20 can flow by connecting the selected memory cell in the main memory array 2 like the Nsa and Nsb of the bias circuit 20 in the first embodiment to set the voltage at the current supply nodes Nsa and Nsb at the same voltage of the Nsa and Nsb of the bias circuit 20 in the first embodiment, respectively. Then, this current is copied from the first active element to the third active element and the fourth active element by the current mirror connection and when this current is input to the current mirror connection consisting of the fifth active element and the sixth active element, a potential difference corresponding to the memory cell current Icell and the reference memory cell current Iref is generated between the output nodes Nouta and Noutb.

An upper limit of a voltage amplification width of the output node Nouta or Noutb in this embodiment is almost Vcc when the difference between the memory cell current Icell and the reference memory cell current Iref is large. A lower limit thereof is about Vss when the memory cell current Icell or the reference memory cell current Iref is zero (0 A). Therefore, there can be provided a larger output potential difference in this embodiment.

In addition, the memory cell current Icell or the reference memory cell current Iref copied to the fourth active element 44a or 44b is used for the output current which drives the output node Nouta or Noutb by 100% in this embodiment. Herein, according to this embodiment, since the current path of the memory cell current Icell or the reference memory cell current Iref copied to the fourth active element 44a or 44b is not divided, the memory cell current Icell or the reference memory cell current Iref can be used for the output current by 100%. Furthermore, since an output speed of the output node Nouta or Noutb depends on an output current whose amount is changed in proportion to changes in the memory cell current Icell or the reference memory cell current Iref, the output speed can be raised.

In addition, the output speed can be further raised by adjusting a mirror ratio for copying the memory cell current Icell or the reference memory cell current Iref from the first active element to the third and fourth active elements in the inventive circuit 6 of this embodiment. In this case, the output speed can be raised by adjusting a transistor size, the number of parallels and the like of the third active element 43a or 43b and the fourth active element 44a or 44b with respect to the first active element 41a or 41b and constituting the transistor size and the like of the fifth active element and the sixth active element largely in the same ratio.

Furthermore, since the output speed can be raised in the inventive circuit 6 of this embodiment, a time until the potential difference between the output nodes Nouta and Noutb reaches the level which can be sensed by the next-stage sense amplifier can be shortened, so that the operation of the sense amplifier can be speeded up.

Next, an inventive device 1 according to another embodiment of the present invention will be described.

Figure 7:
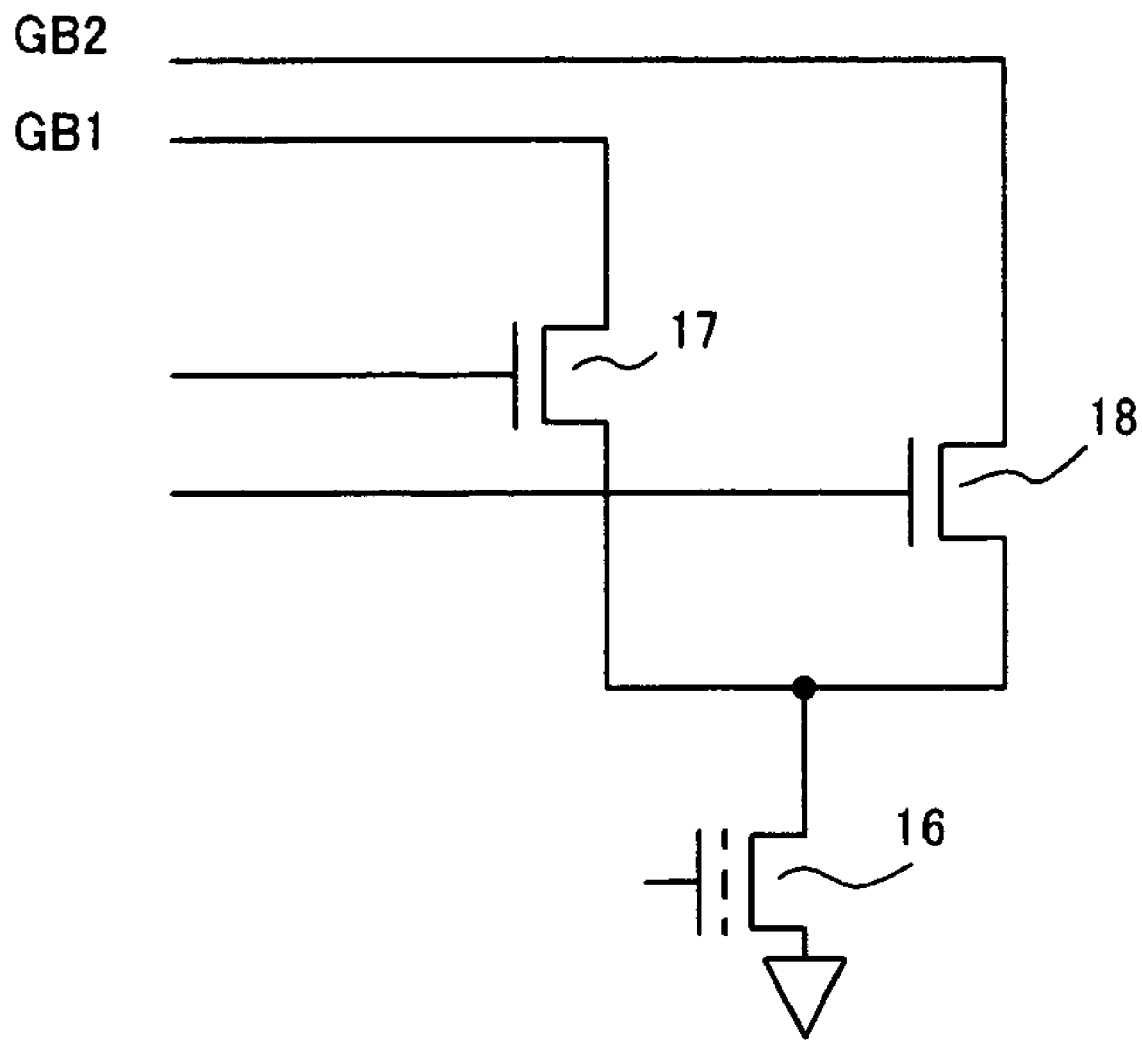
FIG. 7 is a circuit diagram showing a reference circuit according to another embodiment of the semiconductor memory device of the present invention.

(1) Although the reference memory cell is connected to each of the global bit lines GB1 and GB2 in the reference circuit 3 in the above embodiments, one reference memory cell 16 may be connected to the global bit line GB1 or GB2 which is not connected to the selected memory cell, by turning on either the selection transistor 17 or 18 as shown in FIG. 7.

In addition, since the transient response characteristics in the operation for detecting the current difference by applying the bias voltage from the inventive circuit 6 can be considerably improved by equalizing load capacity which is parasitic in the global bit lines GB1 and GB2, the load capacity which is parasitic in the local bit lines can be equally added to the global bit lines GB1 and GB2, respectively, by connecting the local bit line in the block containing the selected memory cell to one of the global bit lines GB1 and GB2 and connecting the local bit line in the adjacent block which does not contain the selected memory cell to the other thereof. However, it is necessary to control so that the word line is not selected in the adjacent block which does not contain the selected memory cell.

(2) Although the transistor size of the first active elements 21a and 21b and the second active elements 22a and 22b is the same, and the transistor size of the third active elements 23a and 23b and the fourth active elements 24a and 24b is the same, so that their current supplying ability under the same bias condition is the same in the inventive circuit 6 of the first embodiment, the transistor size of each corresponding active element is set equal between the first bias circuit 20a and the second bias circuit 20b, but the transistor size of the first active elements 21a or 21b may be different from that of the second active element 22a or 22b in each bias circuit 20. In addition, the transistor size of the third active element 23a or 23b may be different from that of the fourth active element 24a or 24b. Thus, the gain or the transient response characteristics can be adjusted in the inventive circuit 6 because of such flexibility.

(3) Although the flash memory is assumed as the memory cell in the above embodiments, the memory cell is not limited to that. In addition, the memory cell may be a variable resistive element such as MRAM, OUM, RRAM and the like other than the one in which a difference in storage state appears as a difference in threshold voltage of a memory transistor. Furthermore, it may be a memory cell having another constitution. In addition, the present invention may be applied to a volatile memory cell as well as the nonvolatile memory cell.

Although the present invention has been described in terms of the preferred embodiments, it will be appreciated that various modifications and alterations might be made by those skilled in the art without departing from the spirit and scope of the invention. The invention should therefore be measured in terms of the claims which follow.

What is claimed is:

1. A bias voltage applying circuit comprising:

a first bias circuit which supplies a current by applying a predetermined bias voltage to a memory cell selected from a main memory array comprising a plurality of arranged memory cells, converts a memory cell current which flows depending on a storage state of the selected memory cell to a voltage level and outputs it; and a second bias circuit which supplies a current by applying a predetermined bias voltage to a reference memory cell, converts a memory cell current which flows depending on a storage state of the reference memory cell to a voltage level and outputs it, wherein each of the first bias circuit and the second bias circuit which have the same bias circuit constitution comprises:

a first active element between a power supply node and a junction node, in which a current is controlled so as to prevent a voltage level at the junction node from fluctuating;

a second active element between the power supply node and an output node, in which a current is controlled such that a voltage level at the output node is changed in the direction opposite to a voltage level at the junction node of the other side of the bias circuit;

a third active element between the junction node and a current supply node, in which a current from the first active element is supplied to the selected memory cell or the reference memory cell, and a voltage level of the current supply node is controlled at a predetermined level; and a fourth active element between the output node and the current supply node, in which a current from the second active element is supplied to the selected memory cell or the reference memory cell, and a voltage level of the current supply node is controlled at a predetermined level.

2. The bias voltage applying circuit according to claim 1, wherein
each of the first active element and the second active element comprises a P-channel MOSFET.

3. The bias voltage applying circuit according to claim 1, wherein
each of the third active element and the fourth active element comprises an N-channel MOSFET.

4. The bias voltage applying circuit according to claim 1, wherein
the first active element of the first bias circuit and the second active element of the second bias circuit are constituted by current mirror connection, and
the first active element of the second bias circuit and the second active element of the first bias circuit are constituted by current mirror connection.

5. The bias voltage applying circuit according to claim 1, wherein
a current supply ability of the first active element is the same as that of the second active element, and a current supply ability of the third active element is the same as that of the fourth active element under the same bias condition.

6. The bias voltage applying circuit according to claim 1, wherein
a current supply ability of the first active element is different from that of the second active element, and a current supply ability of the third active element is different from that of the fourth active element under the same bias condition.

7. The bias voltage applying circuit according to claim 1, wherein
the first active element comprises a P-channel MOSFET in which a source is connected to the power supply node, and a gate and a drain are connected to the junction node,
the second active element comprises a P-channel MOSFET in which a source is connected to the power supply node, a drain is connected to the output node, and a gate is connected to the junction node of the other side of the bias circuit,
the third active element comprises an N-channel MOSFET in which a source is connected to the current supply node, a drain is connected to the junction node, and a predetermined middle voltage is supplied to a gate, and
the fourth active element comprises an N-channel MOSFET in which a source is connected to the current supply node, a drain is connected to the output node, and the middle voltage is supplied to a gate.

8. A bias voltage applying circuit comprising:
a first bias circuit which supplies a current by applying a predetermined bias voltage to a memory cell selected from a main memory array comprising a plurality of arranged memory cells, converts a memory cell current which flows depending on a storage state of the selected memory cell to a voltage level and outputs it; and
a second bias circuit which supplies a current by applying a predetermined bias voltage to a reference memory cell, converts a memory cell current which flows depending on a storage state of the reference memory cell to a voltage level and outputs it, wherein
each of the first bias circuit and the second bias circuit which have the same bias circuit constitution comprises:
a first active element between a first power supply node and an internal node, in which a voltage level at the internal node is prevented from fluctuating;
a second active element between the internal node and a current supply node, in which a current from the first active element is supplied to the selected memory cell or the reference memory cell and a voltage level at the current supply node is controlled at a predetermined level;
a third active element between the first power supply node and an output node, in which a current amount is changed in proportion to changes in current amount of the selected memory cell or the reference memory cell supplied from the current supply node;
a fourth active element between a junction node and the output node, in which a current is controlled so as to prevent a voltage level at the output node from fluctuating;
a fifth active element between a junction node and the output node, in which a current is controlled such that a voltage level at the output node is changed in the direction opposite to a voltage level at the output node of the other side of the bias circuit; and
a sixth active element between a second power supply node and the junction node, which validates operations of the fourth active element and the fifth active element when the bias circuit is operated, and invalidates operations of the fourth active element and the fifth active element when the bias circuit is not operated, and
the junction node of the first bias circuit is connected to the junction node of the second bias circuit.

9. The bias voltage applying circuit according to claim 8, wherein
each of the first active element and the third active element comprises a P-channel MOSFET, and
each of the second active element, the fourth active element, the fifth active element, and the sixth active element comprises an N-channel MOSFET.

10. The bias voltage applying circuit according to claim 8, wherein
the fourth active element of the first bias circuit and the fifth active element of the second bias circuit are constituted by current mirror connection,
the fourth active element of the second bias circuit and the fifth active element of the first bias circuit are constituted by current mirror connection,
the first active element of the first bias circuit and the third active element of the first bias circuit are constituted by current mirror connection, and
the first active element of the second bias circuit and the third active element of the second bias circuit are constituted by current mirror connection.

11. The bias voltage applying circuit according to claim 8, wherein
a current supply ability of the fourth active element is the same as that of the fifth active element, and a current supply ability of the first active element is the same as that of the third active element under the same bias condition.

12. The bias voltage applying circuit according to claim 8, wherein the first active element comprises a P-channel MOSFET in which a source is connected to the first power supply node, and a gate and a drain are connected to the internal node, the second active element comprises an N-channel MOSFET in which a source is connected to the current supply node, a drain is connected to the internal node, and a predetermined middle voltage is supplied to a gate, the third active element comprises a P-channel MOSFET in which a source is connected to the first power supply node, a gate is connected to the internal node, and a drain is connected to the output node, the fourth active element comprises an N-channel MOSFET in which a source is connected to the junction node, and a gate and a drain are connected to the output node, the fifth active element comprises an N-channel MOSFET in which a source is connected to the junction node, a drain is connected to the output node, and a gate is connected to the output node of the other side of the bias circuit, and the sixth active element comprises an N-channel MOSFET in which a source is connected to the second power supply node, a drain is connected to the junction node, and a predetermined operation control voltage is supplied to a gate.

13. A bias voltage applying circuit comprising:

a first bias circuit which supplies a current by applying a predetermined bias voltage to a memory cell selected from a main memory array comprising a plurality of arranged memory cells, converts a memory cell current which flows depending on a storage state of the selected memory cell to a voltage level and outputs it; and a second bias circuit which supplies a current by applying a predetermined bias voltage to a reference memory cell, converts a memory cell current which flows depending on a storage state of the reference memory cell to a voltage level and outputs it, wherein each of the first bias circuit and the second bias circuit which have the same bias circuit constitution comprises:

a first active element between a first power supply node and an internal node, in which a voltage level at the internal node is prevented from fluctuating;

a second active element between the internal node and a current supply node, in which a current from the first active element is supplied to the selected memory cell or the reference memory cell and a voltage level at the current supply node is controlled at a predetermined level;

a third active element between the first power supply node and a first junction node, in which a current amount is changed in proportion to changes in current amount of the selected memory cell or the reference memory cell supplied from the current supply node;

a fourth active element between the first power supply node and an output node, in which a current amount is changed in proportion to changes in current amount of the selected memory cell or the reference memory cell supplied from the current supply node;

a fifth active element between the first junction node and a second junction node, in which a current is controlled so as to prevent a voltage level at the first junction node from fluctuating;

a sixth active element between the second junction node and the output node, in which a current is controlled such that a voltage level at the output node is changed in the direction opposite to a voltage level at the output node of the other side of the bias circuit; and a seventh active element between a second power supply node and the second junction node, which validates operations of the fifth active element and the sixth active element when the bias circuit is operated, and invalidates operations of the fifth active element and the sixth active element when the bias circuit is not operated, and the second junction node of the first bias circuit is connected to the second junction node of the second bias circuit.

14. The bias voltage applying circuit according to claim 13, wherein each of the first active element, the third active element and the fourth active element comprises a P-channel MOSFET, and each of the second active element, the fifth active element, the sixth active element, and the seventh active element comprises an N-channel MOSFET.

15. The bias voltage applying circuit according to claim 13, wherein the first active element and the third active element are constituted by current mirror connection, the first active element and the fourth active element are constituted by current mirror connection, the fifth active element of the first bias circuit and the sixth active element of the second bias circuit are constituted by current mirror connection, and the fifth active element of the second bias circuit and the sixth active element of the first bias circuit are constituted by current mirror connection.

16. The bias voltage applying circuit according to claim 13, wherein a current supply ability of the fifth active element is the same as that of the sixth active element, and a current supply ability of the first active element is the same as those of the third active element and the fourth active element under the same bias condition.

17. The bias voltage applying circuit according to claim 13, wherein a current supply ability of the fifth active element is the same as that of the sixth active element, a current supply ability of the third active element is the same as that of the fourth active element, a current supply ability of the first active element is different from that of the third active element, and a current supply ability of the first active element is different from that of the fourth active element under the same bias condition.

18. The bias voltage applying circuit according to claim 13, wherein a current supply ability of the fifth active element is the same as that of the sixth active element, and a current supply ability of the third active element is different from that of the fourth active element under the same bias condition.

19. The bias voltage applying circuit according to claim 13,
wherein
the first active element comprises a P-channel MOSFET in which a source is connected to the first power supply node, and a gate and a drain are connected to the internal node,
the second active element comprises an N-channel MOSFET in which a source is connected to the current supply node, a drain is connected to the internal node, and a predetermined middle voltage is supplied to a gate,
the third active element comprises a P-channel MOSFET in which a source is connected to the first power supply node, a gate is connected to the internal node, and a drain is connected to the first junction node,
the fourth active element comprises a P-channel MOSFET in which a source is connected to the first power supply node, a gate is connected to the internal node, and a drain is connected to the output node,
the fifth active element comprises an N-channel MOSFET in which a source is connected to the second junction node, and a gate and a drain are connected to the first junction node,
the sixth active element comprises an N-channel MOSFET in which a source is connected to the second junction node, a drain is connected to the output node, and a gate is connected to the output node of the other side of the bias circuit, and
the seventh active element comprises an N-channel MOSFET in which a source is connected to the second power supply node, a drain is connected to a second junction node, and a predetermined operation control voltage is supplied to a gate.

20. A semiconductor memory device comprising:
a main memory array comprising a plurality of memory cells arranged so as to form an array;
a reference memory cell;
an address selection circuit which selects a particular memory cell from the main memory array;
a bias voltage applying circuit which applies a predetermined bias voltage to a bit line connected to the memory cell selected by the address selection circuit and to a bit line connected to the reference memory cell, converts a memory cell current flowing in each of the selected memory cell and the reference memory cell depending on each storage state to a voltage level and outputs it; and
a sense circuit which compares an output voltage in the selected memory cell with an output voltage in the reference memory cell in the bias voltage applying circuit, amplifies a difference between these output voltages and outputs a voltage corresponding to data stored in the selected memory cell,
wherein
the bias voltage applying circuit is the bias voltage applying circuit according to claim 1, and
when the current supply node of one of the first bias circuit or the second bias circuit in the bias voltage applying circuit is connected to the bit line of the selected memory cell, the current supply node of the other of the first bias circuit or the second bias circuit is connected to the bit line of the reference memory cell.

21. The semiconductor memory device according to claim 20,
wherein
the first bias circuit of the bias voltage applying circuit is constituted such that a current can be supplied to the memory cell selected from the memory cells in a first region of the main memory array,
the second bias circuit of the bias voltage applying circuit is constituted such that a current can be supplied to the memory cell selected from the memory cells in a second region which is different from the first region in the main memory array,
current supply to the selected memory cell in the first region by the first bias circuit, and current supply to the reference memory cell connected to the bit line in the second region by the second bias circuit are generated as one readout operation, and
current supply to the selected memory cell in the second region by the second bias circuit, and current supply to the reference memory cell connected to the bit line in the first region by the first bias circuit are generated as another readout operation.

22. The semiconductor memory device according to claim 20,
wherein
it is constituted such that parasitic capacity of the bit line connected to the selected memory cell is the same as that of the bit line connected to the reference memory cell.

23. A semiconductor memory device comprising:
a main memory array comprising a plurality of memory cells arranged so as to form an array;
a reference memory cell;
an address selection circuit which selects a particular memory cell from the main memory array;
a bias voltage applying circuit which applies a predetermined bias voltage to a bit line connected to the memory cell selected by the address selection circuit and to a bit line connected to the reference memory cell, converts a memory cell current flowing in each of the selected memory cell and the reference memory cell depending on each storage state to a voltage level and outputs it; and
a sense circuit which compares an output voltage in the selected memory cell with an output voltage in the reference memory cell in the bias voltage applying circuit, amplifies a difference between these output voltages and outputs a voltage corresponding to data stored in the selected memory cell,
wherein
the bias voltage applying circuit is the bias voltage applying circuit according to claim 8, and
when the current supply node of one of the first bias circuit or the second bias circuit in the bias voltage applying circuit is connected to the bit line of the selected memory cell, the current supply node of the other of the first bias circuit or the second bias circuit is connected to the bit line of the reference memory cell.

24. The semiconductor memory device according to claim 23,
wherein
the first bias circuit of the bias voltage applying circuit is constituted such that a current can be supplied to the memory cell selected from the memory cells in a first region of the main memory array, the second bias circuit of the bias voltage applying circuit is constituted such that a current can be supplied to the memory cell selected from the memory cells in a second region which is different from the first region in the main memory array, current supply to the selected memory cell in the first region by the first bias circuit, and current supply to the reference memory cell connected to the bit line in the second region by the second bias circuit are generated as one readout operation, and current supply to the selected memory cell in the second region by the second bias circuit, and current supply to the reference memory cell connected to the bit line in the first region by the first bias circuit are generated as another readout operation.

25. The semiconductor memory device according to claim 23,
wherein
it is constituted such that parasitic capacity of the bit line connected to the selected memory cell is the same as that of the bit line connected to the reference memory cell.

26. A semiconductor memory device comprising:
a main memory array comprising a plurality of memory cells arranged so as to form an array;
a reference memory cell;
an address selection circuit which selects a particular memory cell from the main memory array;
a bias voltage applying circuit which applies a predetermined bias voltage to a bit line connected to the memory cell selected by the address selection circuit and to a bit line connected to the reference memory cell, converts a memory cell current flowing in each of the selected memory cell and the reference memory cell depending on each storage state to a voltage level and outputs it; and
a sense circuit which compares an output voltage in the selected memory cell with an output voltage in the reference memory cell in the bias voltage applying circuit, amplifies a difference between these output voltages and outputs a voltage corresponding to data stored in the selected memory cell,
wherein
the bias voltage applying circuit is the bias voltage applying circuit according to claim 13, and
when the current supply node of one of the first bias circuit or the second bias circuit in the bias voltage applying circuit is connected to the bit line of the selected memory cell, the current supply node of the other of the first bias circuit or the second bias circuit is connected to the bit line of the reference memory cell.

27. The semiconductor memory device according to claim 26,
wherein
the first bias circuit of the bias voltage applying circuit is constituted such that a current can be supplied to the memory cell selected from the memory cells in a first region of the main memory array,
the second bias circuit of the bias voltage applying circuit is constituted such that a current can be supplied to the memory cell selected from the memory cells in a second region which is different from the first region in the main memory array,
current supply to the selected memory cell in the first region by the first bias circuit, and current supply to the reference memory cell connected to the bit line in the second region by the second bias circuit are generated as one readout operation, and
current supply to the selected memory cell in the second region by the second bias circuit, and current supply to the reference memory cell connected to the bit line in the first region by the first bias circuit are generated as another readout operation.

28. The semiconductor memory device according to claim 26,
wherein
it is constituted such that parasitic capacity of the bit line connected to the selected memory cell is the same as that of the bit line connected to the reference memory cell.

* * * * *